United States Patent
Kang et al.

(10) Patent No.: US 11,127,900 B2
(45) Date of Patent: Sep. 21, 2021

(54) VARIABLE RESISTANCE MEMORY DEVICES, AND METHODS OF FORMING VARIABLE RESISTANCE MEMORY DEVICES

(71) Applicant: Samsung Electronics Co., Ltd., Suwon-si (KR)

(72) Inventors: Shin-Jae Kang, Seoul (KR); Gyuhwan Oh, Hwaseong-si (KR); Jiyoon Chung, Yongin-si (KR); Junyeon Hwang, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/824,927

(22) Filed: Mar. 20, 2020

(65) Prior Publication Data
US 2020/0220077 A1 Jul. 9, 2020

Related U.S. Application Data

(63) Continuation of application No. 15/862,133, filed on Jan. 4, 2018, now Pat. No. 10,720,577.

(30) Foreign Application Priority Data

Jun. 29, 2017 (KR) .......................... 10-2017-0082399

(51) Int. Cl.
 *H01L 27/24* (2006.01)
 *H01L 45/00* (2006.01)
(52) U.S. Cl.
 CPC ...... *H01L 45/1233* (2013.01); *H01L 27/2427* (2013.01); *H01L 27/2463* (2013.01); *H01L 27/2481* (2013.01); *H01L 45/04* (2013.01); *H01L 45/06* (2013.01); *H01L 45/141* (2013.01); *H01L 45/143* (2013.01); *H01L 45/144* (2013.01); *H01L 45/146* (2013.01); *H01L 45/147* (2013.01); *H01L 45/16* (2013.01)

(58) Field of Classification Search
 CPC combination set(s) only.
 See application file for complete search history.

(56) References Cited

U.S. PATENT DOCUMENTS

| | | | |
|---|---|---|---|
| 8,049,197 B2 | 11/2011 | Kau | |
| 8,349,636 B2 | 1/2013 | Lee et al. | |
| 8,513,136 B2 | 8/2013 | Park et al. | |
| 9,184,384 B2 | 11/2015 | Sandhu et al. | |
| 9,236,567 B2 | 1/2016 | Lee | |
| 9,236,570 B2 | 1/2016 | Chang et al. | |
| 9,343,506 B2 | 5/2016 | Pellizzer | |
| 9,577,010 B2 | 2/2017 | Sciarrillo | |
| 2006/0034117 A1* | 2/2006 | Jeong | G11C 11/16 365/158 |
| 2012/0220087 A1 | 8/2012 | Suh | |

(Continued)

*Primary Examiner* — Moin M Rahman
(74) *Attorney, Agent, or Firm* — Myers Bigel, P.A.

(57) ABSTRACT

Variable resistance memory devices are provided. A variable resistance memory device includes conductive lines and a memory cell including a variable resistance element on one of the conductive lines. The variable resistance memory device includes a first insulating region between the conductive lines. Moreover, the variable resistance memory device includes a second insulating region on the first insulating region between the conductive lines. Methods of forming variable resistance memory devices are also provided.

20 Claims, 35 Drawing Sheets

(56) References Cited

U.S. PATENT DOCUMENTS

| | | |
|---|---|---|
| 2013/0126510 A1 | 5/2013 | Oh et al. |
| 2015/0137061 A1 | 5/2015 | Donghi et al. |
| 2015/0287628 A1 | 10/2015 | You et al. |
| 2015/0318301 A1 | 11/2015 | Lee et al. |
| 2017/0092692 A1 | 3/2017 | Kalnitsky et al. |

* cited by examiner

VARIABLE RESISTANCE MEMORY DEVICES, AND METHODS OF FORMING VARIABLE RESISTANCE MEMORY DEVICES

CROSS-REFERENCE TO RELATED APPLICATIONS

This U.S. non-provisional patent application is a continuation of and claims priority from U.S. patent application Ser. No. 15/862,133, filed on Jan. 4, 2018, which claims priority under 35 U.S.C § 119 to Korean Patent Application No. 10-2017-0082399, filed on Jun. 29, 2017, the entire contents of which are hereby incorporated herein by reference.

BACKGROUND

The present disclosure relates to semiconductor devices and, more particularly, to variable resistance memory devices. Semiconductor devices may include memory devices and logic devices. Memory devices may store data. In general, semiconductor memory devices can be broadly classified as volatile memory devices and nonvolatile memory devices. A volatile memory device, for example, DRAM (Dynamic Random Access Memory) and SRAM (Static Random Access Memory), is a memory device which loses stored data when its power supply is interrupted. A nonvolatile memory device, for example, PROM (programmable ROM), EPROM (erasable PROM), EEPROM (electrically EPROM), and Flash memory, is a memory device which does not lose stored data even when its power supply is inhibited.

Next generation semiconductor memory devices, including, for example, MRAM (magnetic random access memory) and PRAM (phase change random access memory) devices, have been developed to provide high performance and low power in semiconductor memory devices. The next generation semiconductor memory devices may include a material having a resistance that changes depending on applied electric current or voltage, and/or a resistance that is maintained even if the electric current or voltage supply is interrupted.

SUMMARY

Some embodiments of the present inventive concepts provide variable resistance memory devices having improved electrical characteristics and methods of forming (e.g., fabricating) the same.

According to some example embodiments of the present inventive concepts, a variable resistance memory device may include a plurality of first conductive lines extending in a first direction. The variable resistance memory device may include a first insulating pattern extending in the first direction between the plurality of first conductive lines. The variable resistance memory device may include a second insulating pattern on the first insulating pattern and between the plurality of first conductive lines. The variable resistance memory device may include a sub-insulating pattern between the first and second insulating patterns and including a different material from that of the second insulating pattern. The variable resistance memory device may include a plurality of second conductive lines extending in a second direction crossing the first direction and crossing the plurality of first conductive lines. Moreover, the variable resistance memory device may include a plurality of memory cells between the plurality of first conductive lines and the plurality of second conductive lines.

According to some example embodiments of the present inventive concepts, a variable resistance memory device may include a plurality of first conductive lines extending in a first direction. The variable resistance memory device may include an insulation structure extending in the first direction between the plurality of first conductive lines. The variable resistance memory device may include a plurality of second conductive lines extending in a second direction crossing the first direction and crossing the plurality of first conductive lines. The variable resistance memory device may include a plurality of memory cells between the plurality of first conductive lines and the plurality of second conductive lines. Moreover, the insulation structure may include therein first and second gaps that are vertically spaced apart from each other.

According to some example embodiments of the present inventive concepts, a method of forming a variable resistance memory device may include forming a plurality of first conductive lines extending in a first direction and a first insulating pattern extending in the first direction between the plurality of first conductive lines. The method may include forming a mold layer on the plurality of first conductive lines and the first insulating pattern. The method may include forming a recess region exposing side surfaces of one of the plurality of first conductive lines by patterning the mold layer to form a trench in the mold layer and to recess an upper portion of the first insulating pattern that is exposed by the trench. The method may include forming an insulating layer in the recess region and at least a portion of the trench. Moreover, the method may include etching the insulating layer to form a second insulating pattern that is confined to the recess region.

A variable resistance memory device, according to some example embodiments of the present inventive concepts, may include a substrate. The variable resistance memory device may include first and second conductive lines on the substrate. The variable resistance memory device may include a memory cell including a variable resistance element on the first conductive line. The variable resistance memory device may include an electrode between the variable resistance element and the first conductive line. The variable resistance memory device may include a first insulating region on the substrate between the first and second conductive lines. The variable resistance memory device may include a second insulating region in a recessed portion of the first insulating region between the first and second conductive lines. Moreover, an uppermost surface of the second insulating region may be coplanar with respective uppermost surfaces of the first and second conductive lines.

DETAILED DESCRIPTION

Example embodiments of the present inventive concepts will be described hereinafter in conjunction with the accompanying drawings.

Figure 1:
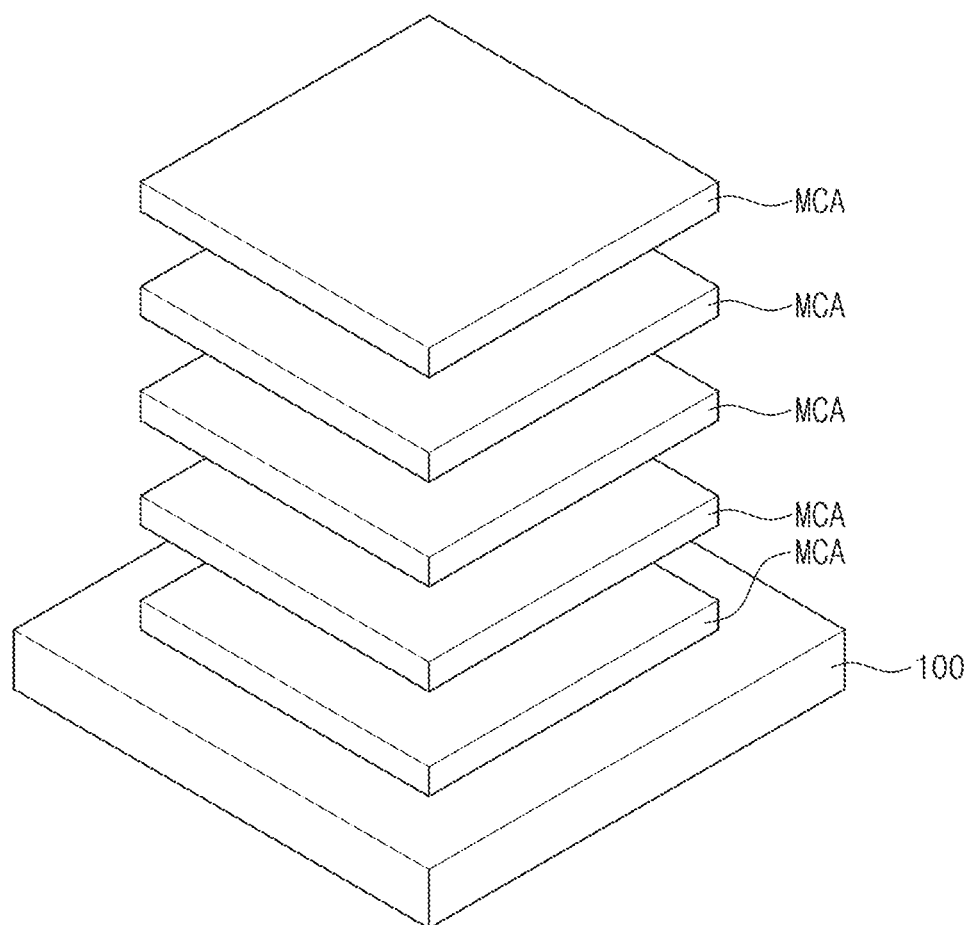
FIG. 1 illustrates a schematic diagram showing a variable resistance memory device according to example embodiments of the present inventive concepts.

FIG. 1 illustrates a schematic diagram showing a variable resistance memory device according to example embodiments of the present inventive concepts.

Referring to FIG. 1, a variable resistance memory device may include a plurality of memory cell stacks MCA that are sequentially stacked on a substrate 100. As referred to herein, the "primary surface" of the substrate 100 is the uppermost surface of the substrate 100 having the memory cell stacks MCA thereon. Each of the memory cell stacks MCA may include a plurality of two-dimensionally arranged memory cells. The variable resistance memory device may include a plurality of conductive lines that lie between the memory cell stacks MCA and configure the memory cells to perform writing, reading, and/or erasing operations. FIG. 1 shows five memory cell stacks MCA, but the present inventive concepts are not limited thereto.

Figure 2:
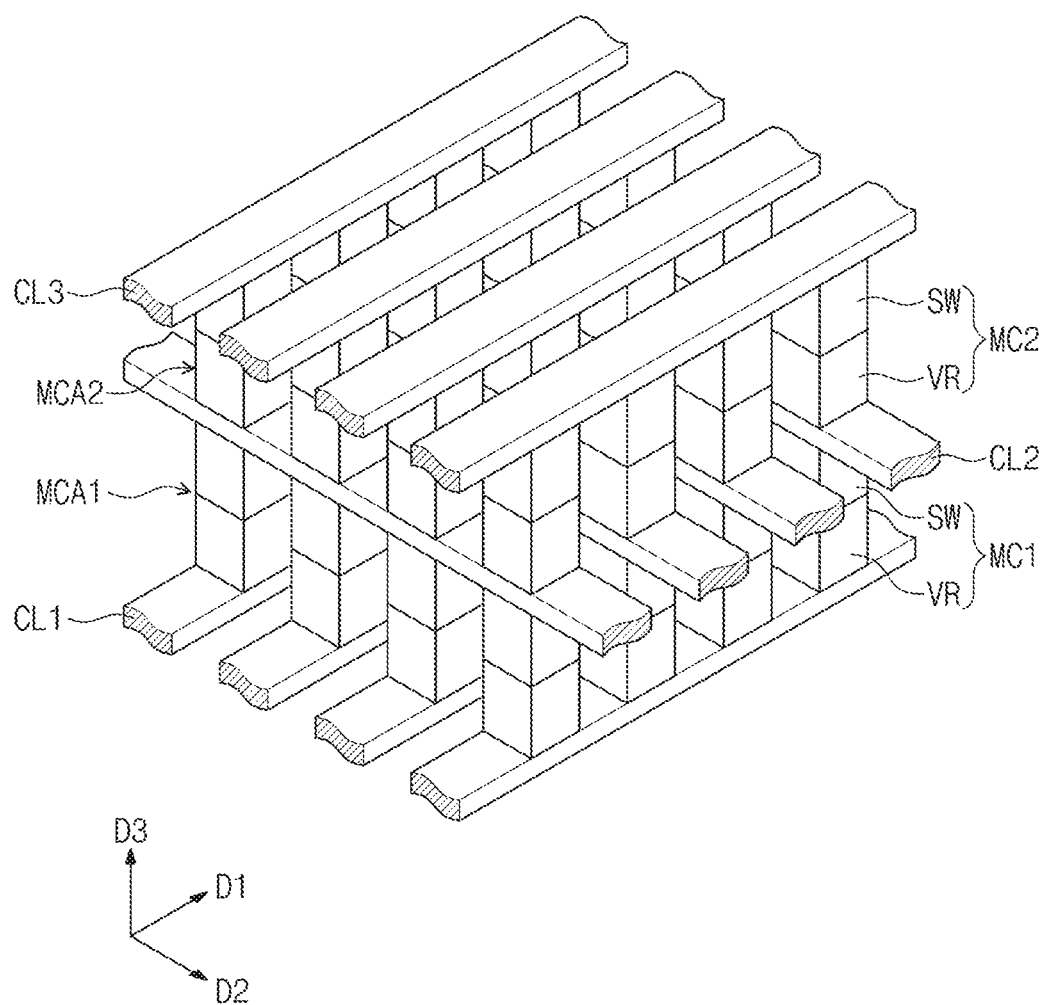
FIG. 2 illustrates a simplified perspective view showing a variable resistance memory device according to example embodiments of the present inventive concepts.

FIG. 2 illustrates a simplified perspective view showing a variable resistance memory device according to example embodiments of the present inventive concepts. FIG. 2 shows an example that includes two memory cell stacks MCA1 and MCA2 adjacent to each other, but the present inventive concepts are not limited thereto.

Referring to FIG. 2, a variable resistance memory cell may include first conductive lines CL1 extending in a first direction D1, second conductive lines CL2 extending in a second direction D2 crossing the first direction D1, and third conductive lines CL3 extending in the first direction D1. The first, second, and third conductive lines CL1, CL2, and CL3 may be sequentially provided along a third direction D3 perpendicular to the first and second directions D1 and D2. In some embodiments, the first conductive lines CL1 may be respective word lines, and the third conductive lines CL3 may be respective word lines. Moreover, the second conductive lines CL2 may be respective bit lines. Additionally or alternatively, a pair of the first conductive lines CL1 may, in some embodiments, be referred to herein as "first" and "second" conductive lines, and ones of the second and third conductive lines CL2, CL3 may be referred to herein as "third" and "fourth" conductive lines, respectively.

A first memory cell stack MCA1 may be provided between the first conductive lines CL1 and the second conductive lines CL2, and a second memory cell stack MCA2 may be provided between the second conductive lines CL2 and the third conductive lines CL3. The first memory cell stack MCA1 may include first memory cells MC1 that are respectively/correspondingly provided at intersections, as seen in a plan view, of the first conductive lines CL1 and the second conductive lines CL2. The first memory cells MC1 may be two-dimensionally arranged in a row-and-column fashion. The second memory cell stack MCA2 may include second memory cells MC2 that are respectively/correspondingly provided at intersections, as seen in a plan view, of the second conductive lines CL2 and the third conductive lines CL3. The second memory cells MC2 may be two-dimensionally arranged in a row-and-column fashion.

Each of the first and second memory cells MC1 and MC2 may include a variable resistance element VR and a select element SW. The variable resistance element VR and the select element SW may be coupled in series between a pair of their respective/corresponding conductive lines CL1, CL2, and CL3. For example, the variable resistance element VR and the select element SW included in each of the first memory cells MC1 may be coupled in series between a respective/corresponding first conductive line CL1 and a respective/corresponding second conductive line CL2, that are connected to opposite ends of the respective/corresponding first memory cell MC1, and the variable resistance element VR and the select element SW included in each of the second memory cells MC2 may be coupled in series between a respective/corresponding second conductive line CL2 and a respective/corresponding third conductive line CL3, that are connected to opposite ends of the respective/corresponding second memory cell MC2. FIG. 2 shows that the select element SW is placed above the variable resistance element VR, but the present inventive concepts are not limited thereto. For example, differently from that shown in FIG. 2, the variable resistance element VR may be placed above the select element SW.

Figure 3:
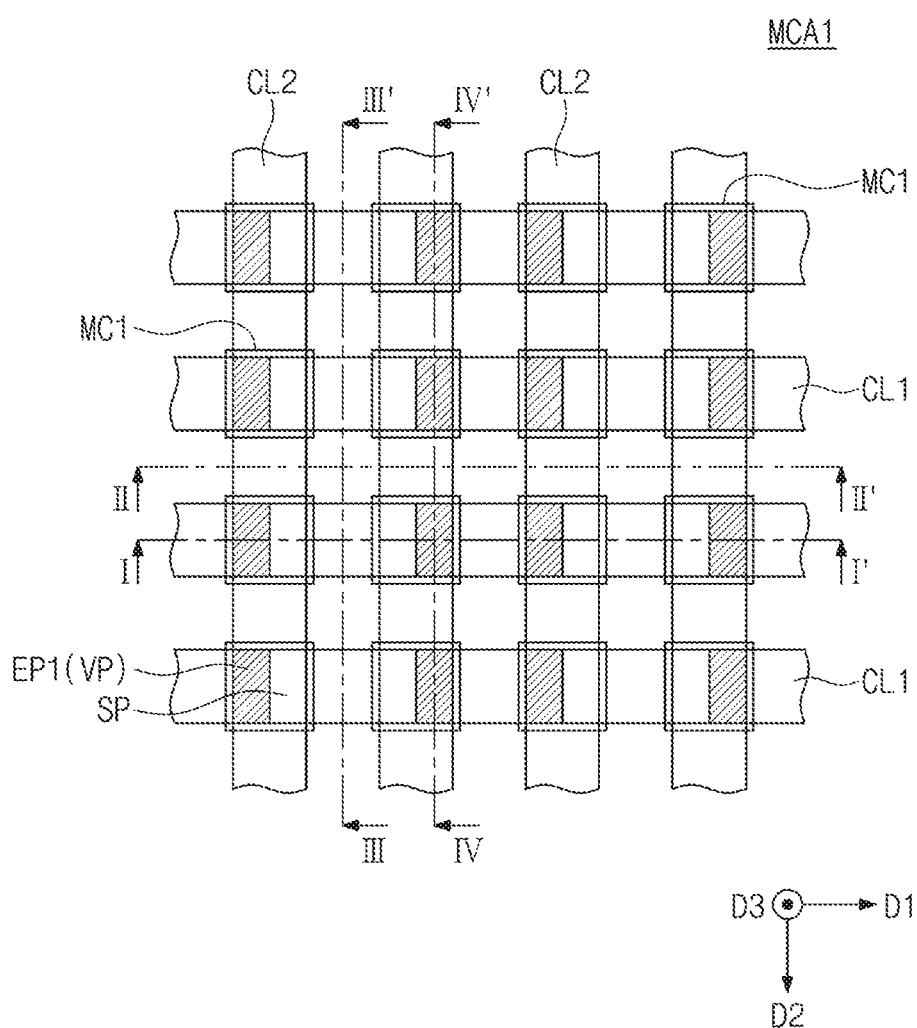
FIG. 3 illustrates a plan view showing a variable resistance memory device according to example embodiments of the present inventive concepts.
Figure 4A:
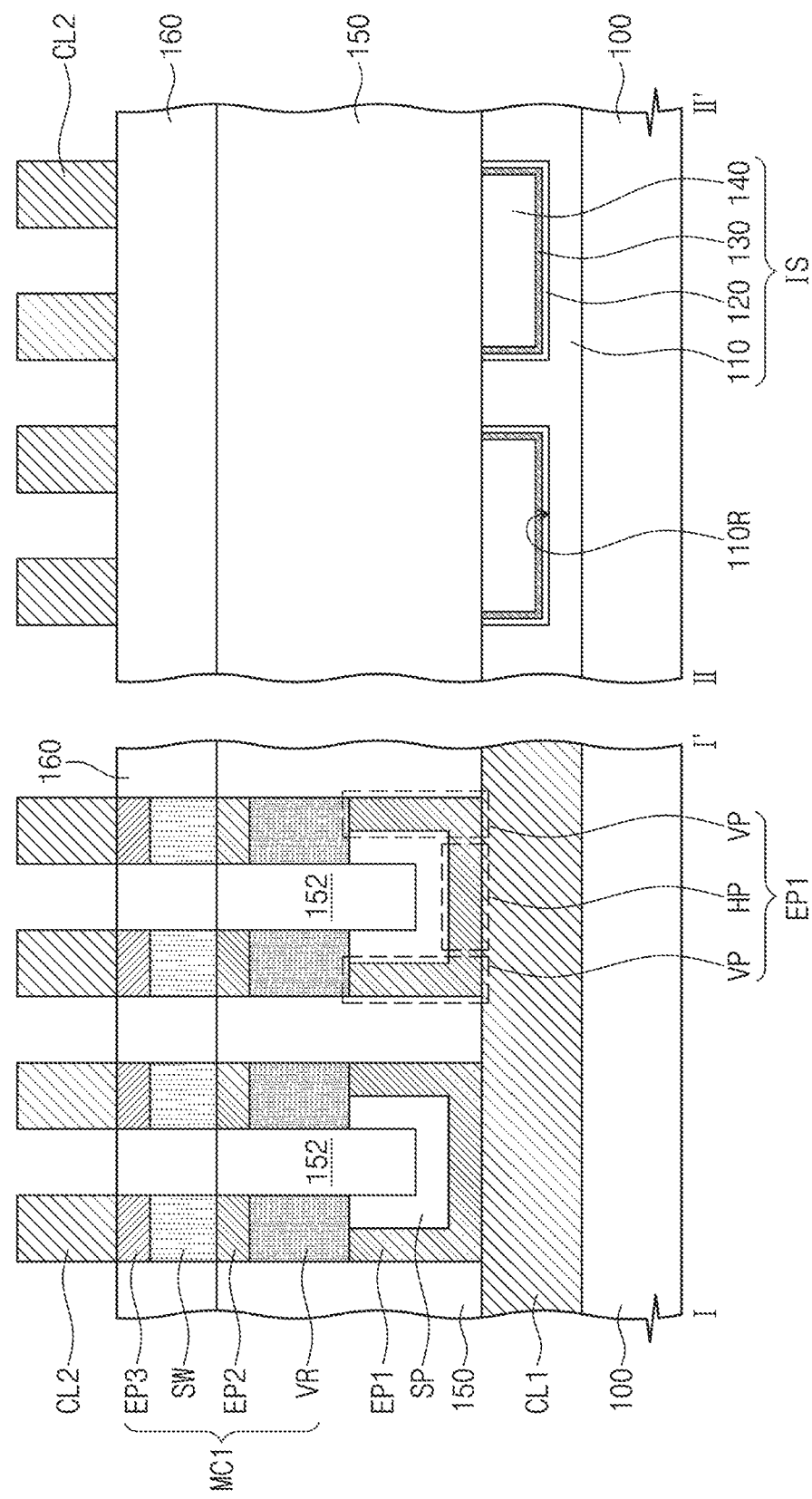
FIG. 4A illustrates a cross-sectional view taken along lines I-I' and II-II' of FIG. 3.
Figure 4B:
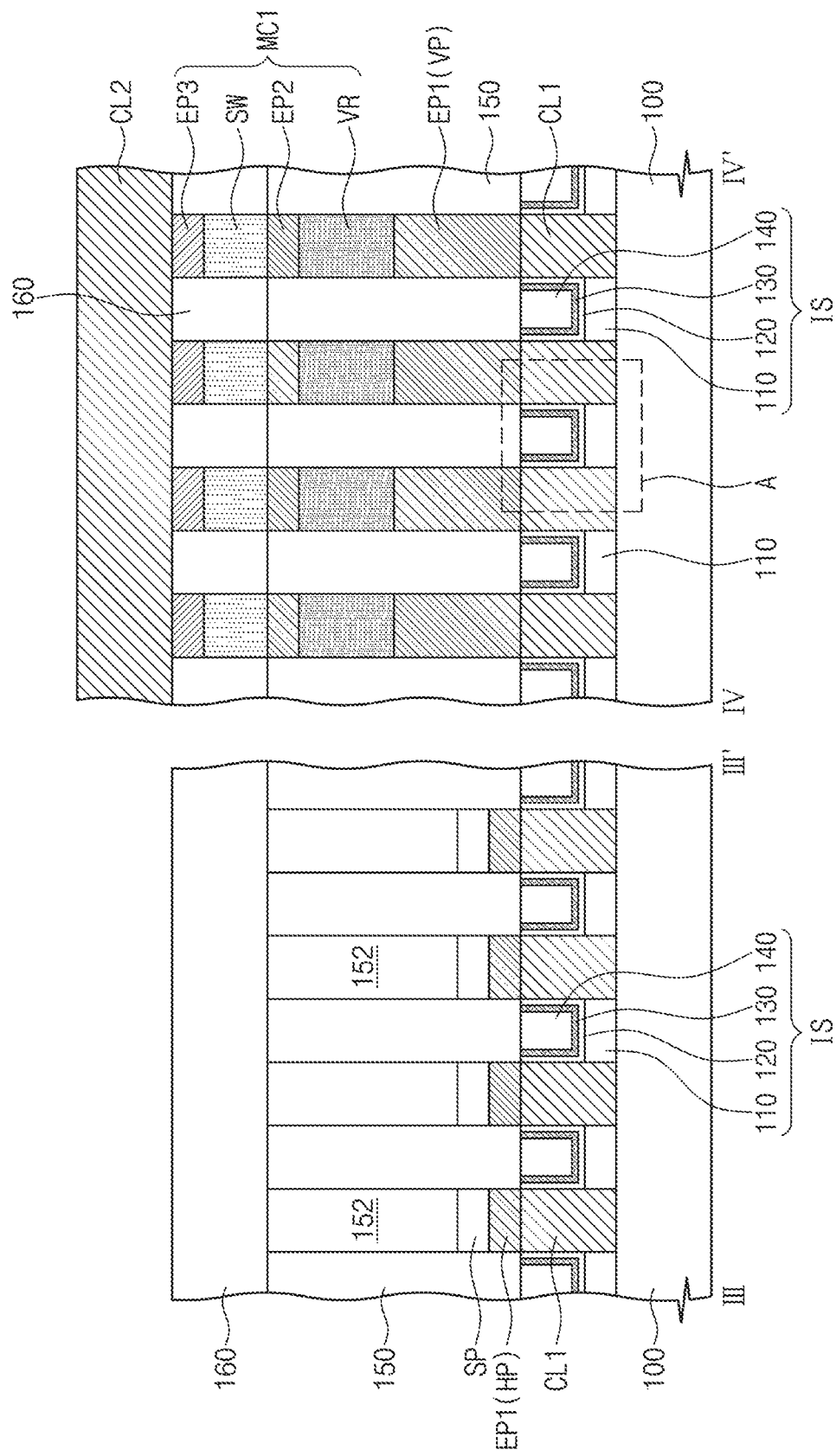
FIG. 4B illustrates a cross-sectional view taken along lines III-III' and IV-IV' of FIG. 3.
Figure 5A:
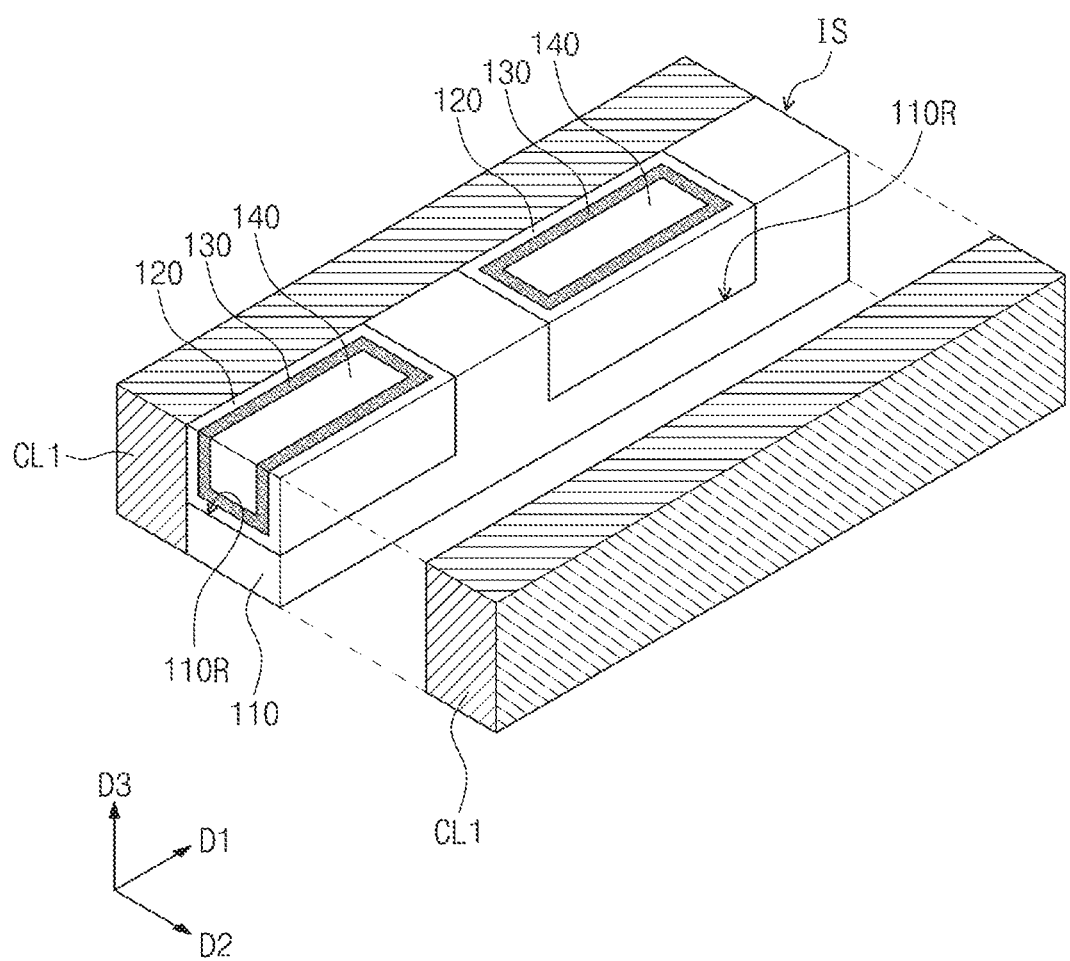
FIG. 5A illustrates a simplified perspective view showing section A of FIG. 4B.
Figure 5B:
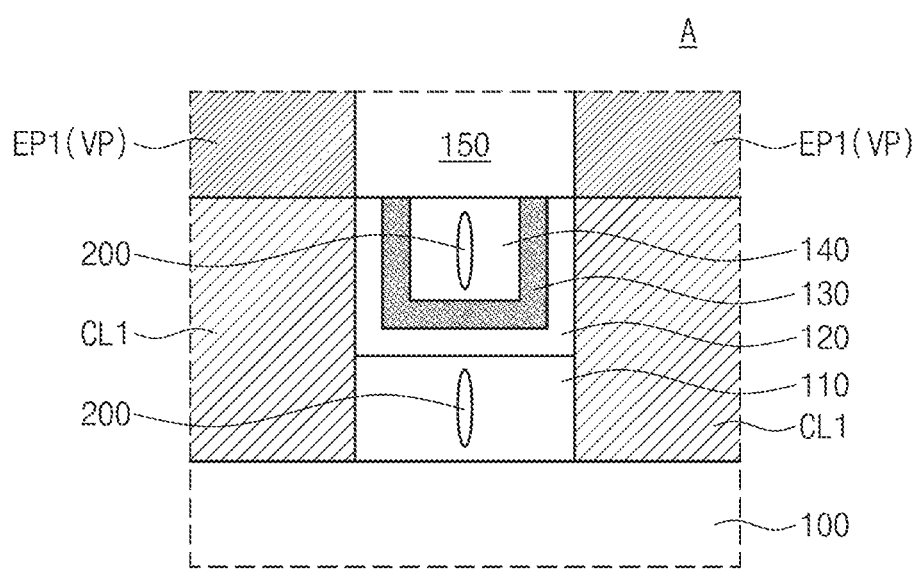
FIG. 5B illustrates an enlarged cross-sectional view showing section A of FIG. 4B.

FIG. 3 illustrates a plan view showing a variable resistance memory device according to example embodiments of the present inventive concepts. FIG. 4A illustrates a cross-sectional view taken along lines I-I' and II-II' of FIG. 3. FIG. 4B illustrates a cross-sectional view taken along lines III-III' and IV-IV' of FIG. 3. FIG. 5A illustrates a simplified perspective view showing section A of FIG. 4B. FIG. 5B illustrates an enlarged cross-sectional view showing section A of FIG. 4B. For brevity of description, the first memory cell stack MCA1 is selectively chosen to describe in detail the variable resistance memory device according to example embodiments of the present inventive concepts.

Referring to FIGS. 3, 4A, and 4B, first conductive lines CL1 may be provided on a substrate 100. The first conductive lines CL1 may extend in the first direction D1 and be spaced apart from each other along the second direction D2. The substrate 100 may be provided thereon with a first insulating pattern 110 between the first conductive lines CL1. The first insulating pattern 110 may extend in the first direction D1 between the first conductive lines CL1. The first conductive lines CL1 may include metal (e.g., copper, tungsten, or aluminum) and/or metal nitride (e.g., tantalum nitride, titanium nitride, or tungsten nitride). The first insulating pattern 110 may include, for example, silicon nitride.

The first insulating pattern 110 may be provided thereon with a second insulating pattern 140 between the first conductive lines CL1. The second insulating pattern 140 may be inserted into the first insulating pattern 110. For example, the first insulating pattern 110 may have a top surface with a recess (i.e., recessed) surface 110R. The recess surface 110R may be a concave surface curved inwardly from the top surface of the first insulating pattern 110. The second insulating pattern 140 may be provided on the recess surface 110R of the first insulating pattern 110. In some embodiments, the second insulating pattern 140 may include the same material (i.e., a common material) as that of the first insulating pattern 110. For example, the second insulating pattern 140 may include silicon nitride. Alternatively, the second insulating pattern 140 may include a different material from that of the first insulating pattern 110. Moreover, in some embodiments, the first and second insulating patterns 110, 140 may be referred to herein as respective insulating "regions."

A first sub-insulating pattern 130 may be provided between the first insulating pattern 110 and the second insulating pattern 140. The first sub-insulating pattern 130 may conformally cover the recess surface 110R of the first insulating pattern 110. The second insulating pattern 140 may be spaced apart from the first insulating pattern 110 across the first sub-insulating pattern 130 (or with the first sub-insulating pattern 130 interleaved therebetween). The first sub-insulating pattern 130 may extend between the second insulating pattern 140 and each of the first conductive lines CL1. The second insulating pattern 140 may be spaced apart from the first conductive lines CL1 by/across the first sub-insulating pattern 130. As viewed in cross-section, the first sub-insulating pattern 130 may have a "U" shape and cover at least a portion of the second insulating pattern 140. The first sub-insulating pattern 130 may include a different material from that of the second insulating pattern 140. The first sub-insulating pattern 130 may include a material having an etch selectivity to the second insulating pattern 140. For example, the first sub-insulating pattern 130 may include silicon oxide.

A second sub-insulating pattern 120 may be interposed between the first sub-insulating pattern 130 and each of the first conductive lines CL1. The second sub-insulating pattern 120 may be in contact with a side surface of each of the first conductive lines CL1. The first sub-insulating pattern 130 may be spaced apart from the first conductive lines CL1 by/across the second sub-insulating pattern 120. The second sub-insulating pattern 120 may extend between the first sub-insulating pattern 130 and the first insulating pattern 110. The second sub-insulating pattern 120 may conformally cover the recess surface 110R of the first insulating pattern 110. The first sub-insulating pattern 130 may be spaced apart from the first insulating pattern 110 by/across the second sub-insulating pattern 120. As viewed in cross-section, the second sub-insulating pattern 120 may have a "U" shape and cover at least a portion of the first sub-insulating pattern 130. The second sub-insulating pattern 120 may include a different material from that of the first sub-insulating pattern 130. In some embodiments, the second sub-insulating pattern 120 may include the same material as that of the second insulating pattern 140. For example, the second sub-insulating pattern 120 may include silicon nitride. Moreover, in some embodiments, either of the first sub-insulating pattern 130 and the second sub-insulating pattern 120 may be referred to herein as an "insulating layer."

Referring to FIG. 5A, a plurality of the second insulating patterns 140 may be provided on the first insulating pattern 110. The plurality of the second insulating patterns 140 may be spaced apart from each other in the first direction D1 on the first insulating pattern 110. Each of the plurality of the second insulating patterns 140 may be interposed between the first conductive lines CL1 and inserted into the first insulating pattern 110. For example, the top surface of the first insulating pattern 110 may include a plurality of the recess surfaces (i.e., a plurality of recesses) 110R spaced apart from each other in the first direction D1, and the plurality of the second insulating patterns 140 may be respectively/correspondingly provided on the plurality of the recess surfaces 110R.

A plurality of the first sub-insulating patterns 130 may be respectively/correspondingly provided between the first insulating pattern 110 and the plurality of the second insulating patterns 140. Each of the plurality of the first sub-insulating patterns 130 may extend adjacent/onto a side surface of each of the first conductive lines CL1. Each of the plurality of the second insulating patterns 140 may be spaced apart from the first insulating pattern 110 and the first conductive lines CL1 by/across a respective one of the plurality of the first sub-insulating patterns 130.

A plurality of the second sub-insulating patterns 120 may be respectively/correspondingly provided between the first insulating pattern 110 and the plurality of the first sub-insulating patterns 130. Each of the plurality of the second sub-insulating patterns 120 may extend onto the side surface of each of the first conductive lines CL1. Each of the plurality of the first sub-insulating patterns 130 may be spaced apart from the first insulating pattern 110 and the first conductive lines CL1 by/across a respective one of the plurality of the second sub-insulating patterns 120.

Referring to FIG. 5B, in some embodiments, at least one of the first insulating pattern 110 and the second insulating pattern 140 may include an air gap 200 therein. When each of the first and second insulating patterns 110 and 140 includes the air gap 200, the air gap 200 of the second insulating pattern 140 may be spaced apart from the air gap 200 of the first insulating pattern 110 by/across the first sub-insulating pattern 130. Although the term "air gap" is used herein, the gap 200 may be any "void" or "gap," and is not necessarily filled with air.

Referring back to FIGS. 3, 4A, and 4B, the first and second insulating patterns 110 and 140 and the first and second sub-insulating patterns 130 and 120 may be collectively referred to as an insulation structure IS. The insulation structure IS may be interposed between the first conductive lines CL1 and may extend in the first direction D1.

Second conductive lines CL2 may be provided to run across the first conductive lines CL1 and the insulation structure IS. The second conductive lines CL2 may extend in the second direction D2 and be spaced apart from each other in the first direction D1. The second conductive lines CL2 may be spaced apart in the third direction D3 from the first conductive lines CL1 and the insulation structure IS.

The second conductive lines CL2 may include metal (e.g., copper, tungsten, or aluminum) and/or metal nitride (e.g., tantalum nitride, titanium nitride, or tungsten nitride).

First memory cells MC1 may be respectively/correspondingly disposed at intersections of the first conductive lines CL1 and the second conductive lines CL2, in a plan view. The first memory cells MC1 may be two-dimensionally arranged along the first and second directions D1 and D2. The first memory cells MC1 may constitute a first memory cell stack MCA1. Although only one memory cell stack MCA1 is illustrated for convenience of description, a plurality of memory cell stacks may be stacked along the third direction D3 on the substrate 100. Accordingly, the substrate 100 may be provided thereon with repeatedly stacked components corresponding to the first conductive lines CL1, the insulation structure IS, the second conductive lines CL2, and the first memory cell stack MCA1.

Each of the first memory cells MC1 may be provided between a respective/corresponding one of the first conductive lines CL1 and a respective/corresponding one of the second conductive lines CL2. Each of the first memory cells MC1 may include a variable resistance element VR and a select element SW that are coupled in series between the respective/corresponding first conductive line CL1 and the respective/corresponding second conductive line CL2. For example, when viewed in a plan view, the variable resistance element VR may be shaped like an island confined within an intersection of the respective/corresponding first conductive line CL1 and the respective/corresponding second conductive line CL2. Alternatively, differently from that shown, the variable resistance element VR may be shaped like a line elongated either in the first direction D1 or in the second direction D2. In this case, the variable resistance element VR may be shared between a plurality of first memory cells MC1 that are arranged either along the first direction D1 or along the second direction D2. The select element SW may be shaped, for example, like an island confined within an intersection of the respective/corresponding first conductive line CL1 and the respective/corresponding second conductive line CL2, when viewed in a plan view. Alternatively, differently from that shown, the select element SW may be shaped like a line elongated either in the first direction D1 or in the second direction D2. In this case, the select element SW may be shared between a plurality of first memory cells MC1 that are arranged either along the first direction D1 or along the second direction D2. The variable resistance element VR may be provided between the substrate 100 and the select element SW, but the present inventive concepts are not limited thereto. Differently from that shown, the select element SW may be provided between the substrate 100 and the variable resistance element VR.

The variable resistance element VR may include a material capable of storing data, based on resistance variation. For example, the variable resistance element VR may include a material that is configured to reversibly change its phase between a crystalline state and an amorphous state, based on a temperature of the material. The variable resistance element VR may include a compound in which one or more of Tellurium (Te) and Selenium (Se) (chalcogen elements) is combined with one or more of Germanium (Ge), Antimony (Sb), Bismuth (Bi), Lead (Pb), Tin (Sn), Silver (Ag), Arsenic (As), Sulfur (S), Silicon (Si), Indium (In), Titanium (Ti), Gallium (Ga), Phosphorus (P), Oxygen (O), and Carbon (C). For example, the variable resistance element VR may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. Alternatively, the variable resistance element VR may include a superlattice structure in which a Ge-containing layer (e.g., GeTe layer) and a Ge-free layer (e.g., SbTe layer) are repeatedly stacked.

In some embodiments, the variable resistance element VR may include one or more of a perovskite compound and conductive metal oxide. For example, the variable resistance element VR may include one or more of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, and barium-strontium-zirconium oxide. Alternatively, the variable resistance element VR may be a double-structure including a conductive metal oxide layer and a tunnel insulating layer or a triple-structure including a first conductive metal oxide layer, a tunnel insulating layer, and a second conductive metal oxide layer. For example, the tunnel insulating layer may include aluminum oxide, hafnium oxide, and/or silicon oxide.

The select element SW may be a device based on a threshold switching phenomenon exhibiting a nonlinear I-V curve (e.g., S-type I-V curve). For example, the select element SW may be an OTS (Ovonic Threshold Switch) device exhibiting bidirectional characteristics. The select element SW may be associated with a phase transition temperature between a crystalline state and an amorphous state that is greater than a phase transition temperature associated with the variable resistance element VR. Therefore, when operating a variable resistance memory device according to example embodiments of the present inventive concepts, the variable resistance element VR may be configured to reversibly change phase between its crystalline and amorphous states, while the select element SW may maintain its substantially amorphous state without the phase transition. In this description, the substantially amorphous state may not exclude the presence of a locally crystalline grain boundary or a locally crystalline portion in an object (e.g., the select element SW).

The select element SW may include a chalcogenide material. The chalcogenide material may include a compound in which one or more of Te and Se (chalcogen elements) is combined with one or more of Ge, Sb, Bi, Aluminum (Al), Pb, Sn, Ag, As, S, Si, In, Ti, Ga, and P. For example, the chalcogenide material may include one or more of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe. In some embodiments, the select element SW may further include an impurity, for example, one or more of C, Nitrogen (N), Boron (B), and O. Moreover, in some embodiments, the select element SW may be referred to herein as a "chalcogenide layer."

Each of the first memory cells MC1 may include a middle electrode EP2 between the variable resistance element VR and the select element SW. The middle electrode EP2 may electrically connect the variable resistance element VR and the select element SW to each other, and may inhibit/prevent a direct contact between the variable resistance element VR and the select element SW. The middle electrode EP2 may include one or more of Tungsten (W), Ti, Al, Copper (Cu), C, CN, TiN, TiAlN, TiSiN, TiCN, WN, CoSiN, WSiN, TaN, TaCN, and TaSiN.

Each of the first memory cells MC1 may include a top electrode EP3 between the select element SW and the respective/corresponding second conductive line CL2. The select element SW may be electrically connected through the top electrode EP3 to the respective/corresponding second conductive line CL2. The top electrode EP3 may be spaced apart from the middle electrode EP2 by/across the select element SW. The top electrode EP3 may be shaped like an island confined within an intersection of the respective/corresponding first conductive line CL1 and the respective/corresponding second conductive line CL2, when viewed in a plan view. A plurality of the top electrodes EP3 included in the first memory cells MC1 may be respectively/correspondingly provided at intersections of the first conductive lines CL1 and the second conductive lines CL2, and may thereby be two-dimensionally arranged on the substrate 100. In some embodiments, differently from that shown, the top electrode EP3 may have a linear shape extending in an extending direction (e.g., the second direction D2) of the respective/corresponding second conductive line CL2. In this case, the top electrode EP3 may be shared between a plurality of first memory cells MC1 that are arranged in the extending direction (e.g., the second direction D2) of the respective/corresponding second conductive line CL2. The top electrode EP3 may include one or more of W, Ti, Al, Cu, C, CN, TiN, TiAlN, TiSiN, TiCN, WN, CoSiN, WSiN, TaN, TaCN, TaSiN, and TiO.

A bottom electrode EP1 may be provided between the respective/corresponding first conductive line CL1 and each of the first memory cells MC1. Each of the first memory cells MC1 may be electrically connected through the bottom electrode EP1 to the respective/corresponding first conductive line CL1. The bottom electrode EP1 may be spaced apart from the middle electrode EP2 by/across the variable resistance element VR. The bottom electrode EP1 may be shared between a pair of ones, which are adjacent to each other in the first direction D1, of the first memory cells MC1. For example, the pair of first memory cells MC1 may be commonly connected through one bottom electrode EP1 to the respective/corresponding first conductive line CL1. The bottom electrode EP1 may include vertical portions VP that are respectively/correspondingly connected to the pair of first memory cells MC1 and a horizontal portion HP that extends onto the respective/corresponding first conductive line CL1 between the pair of first memory cells MC1. The horizontal portion HP may extend along a top surface of the respective/corresponding first conductive line CL1 between the pair of first memory cells MC1, and may connect the vertical portions VP to each other. As viewed in cross-section, the bottom electrode EP1 may have a "U" shape. The bottom electrode EP1 may be a heater electrode that heats the variable resistance element VR to change the phase state of the variable resistance element VR. The bottom electrode EP1 may include a material whose resistivity is greater than those of the first and second conductive lines CL1 and CL2. The bottom electrode EP1 may include one or more of W, Ti, Al, Cu, C, CN, TiN, TiAlN, TiSiN, TiCN, WN, CoSiN, WSiN, TaN, TaCN, TaSiN, and TiO.

A spacer SP may be provided between the vertical portions VP of the bottom electrode EP1. The spacer SP may be provided on facing (i.e., opposing) sidewalls of the vertical portions VP and may extend along a top surface of the horizontal portion HP. As viewed in cross-section, the spacer SP may have a "U" shape. The horizontal portion HP may extend between the spacer SP and the top surface of the respective/corresponding first conductive line CL1 that is commonly connected to the pair of first memory cells MC1. The spacer SP may include polycrystalline silicon or silicon oxide.

A buried insulating pattern 152 may be provided between the vertical portions VP of the bottom electrode EP1. The spacer SP may be interposed between the buried insulating pattern 152 and each of the vertical portions VP and between the buried insulating pattern 152 and the horizontal portion HP. The buried insulating pattern 152 may extend between the pair of first memory cells MC1, and may cover sidewalls of the middle electrode EP2 and the variable resistance element VR that are included in each of the pair of first memory cells MC1. The buried insulating pattern 152 may include one or more of silicon oxide, silicon nitride, and silicon oxynitride.

A first interlayer dielectric layer 150 may be provided on the substrate 100. The first interlayer dielectric layer 150 may be on (e.g., may cover) the first conductive lines CL1 and the insulation structure IS, and may further be on (e.g., may cover) the bottom electrode EP1, the spacer SP, and the buried insulating pattern 152. The first interlayer dielectric layer 150 may be on (e.g., may cover) the middle electrode EP2 and the variable resistance element VR included in each of the first memory cells MC1. A second interlayer dielectric layer 160 may be provided on the first interlayer dielectric layer 150. The second interlayer dielectric layer 160 may be on (e.g., may cover) the top electrode EP3 and the select element SW included in each of the first memory cells MC1. The second conductive lines CL2 may be provided on the second interlayer dielectric layer 160. The first and second interlayer dielectric layers 150 to 160 may include one or more of silicon oxide, silicon nitride, and silicon oxynitride.

According to the present inventive concepts, the insulation structure IS may be provided between a pair of the first conductive lines CL1. The insulation structure IS may include the first insulating pattern 110 and the second insulating pattern 140 on the recess surface 110R of the first insulating pattern 110. Because the second insulating pattern 140 is provided on the recess surface 110R, a top surface of the insulation structure IS may be at substantially the same height as (i.e., may be coplanar with) that of top surfaces of the first conductive lines CL1. It therefore may be relatively easy to form an upper structure provided on the first conductive lines CL1 and on the insulation structure IS.

Figure 6:
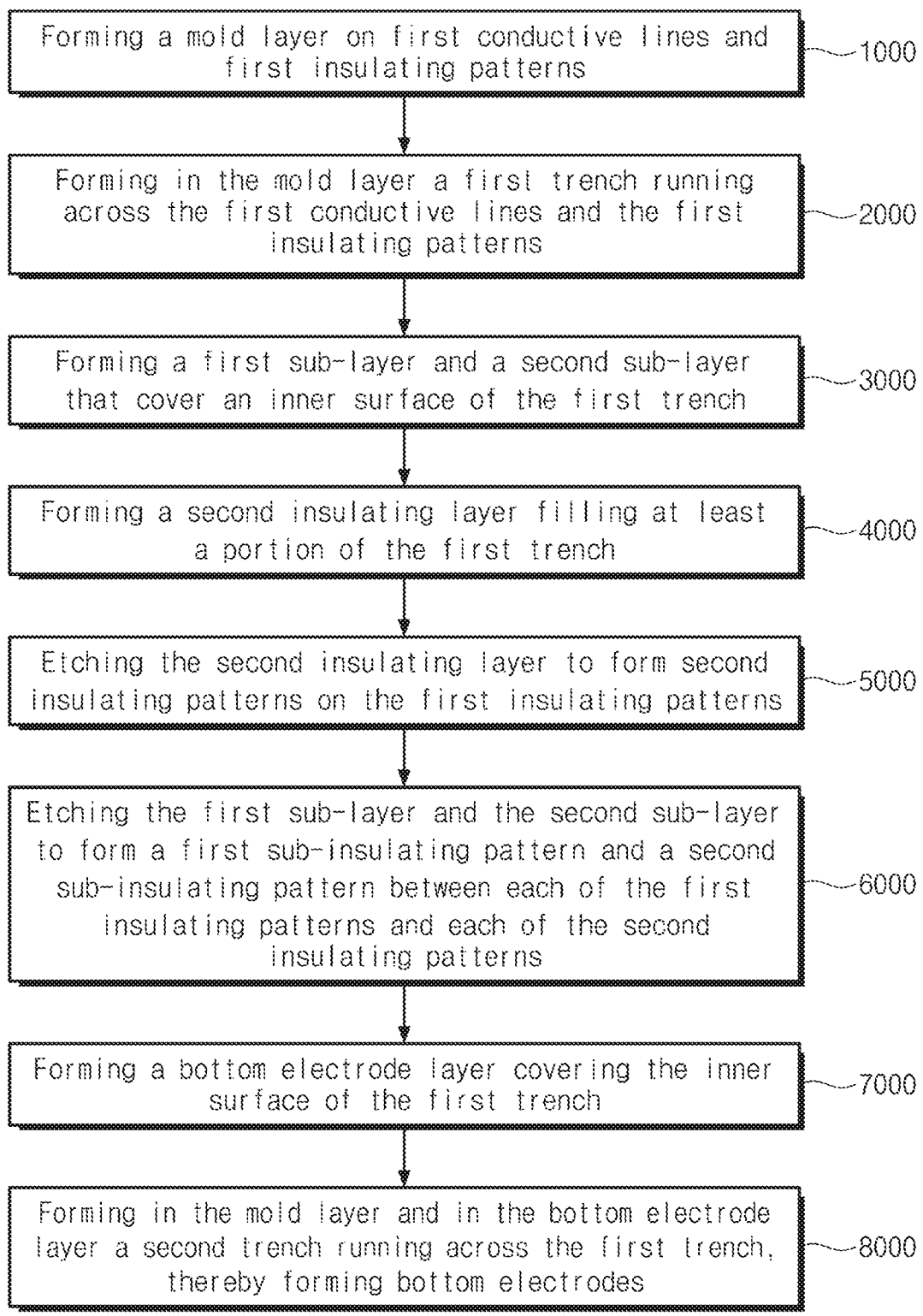
FIG. 6 illustrates a flow chart showing a method of fabricating a variable resistance memory device according to example embodiments of the present inventive concepts.

FIG. 6 illustrates a flow chart showing a method of fabricating a variable resistance memory device according to example embodiments of the present inventive concepts. FIGS. 7A, 8A, 9A, 10A, 11A, 12A, 13A, 14A, and 15A illustrate cross-sectional views each taken along lines I-I' and II-II' of FIG. 3, showing a method of fabricating a variable resistance memory device according to example embodiments of the present inventive concepts. FIGS. 7B, 8B, 9B, 10B, 11B, 12B, 13B, 14B, and 15B illustrate cross-sectional views each taken along lines III-III' and IV-IV' of FIG. 3, showing a method of fabricating a variable resistance memory device according to example embodiments of the present inventive concepts.

Figure 7A:
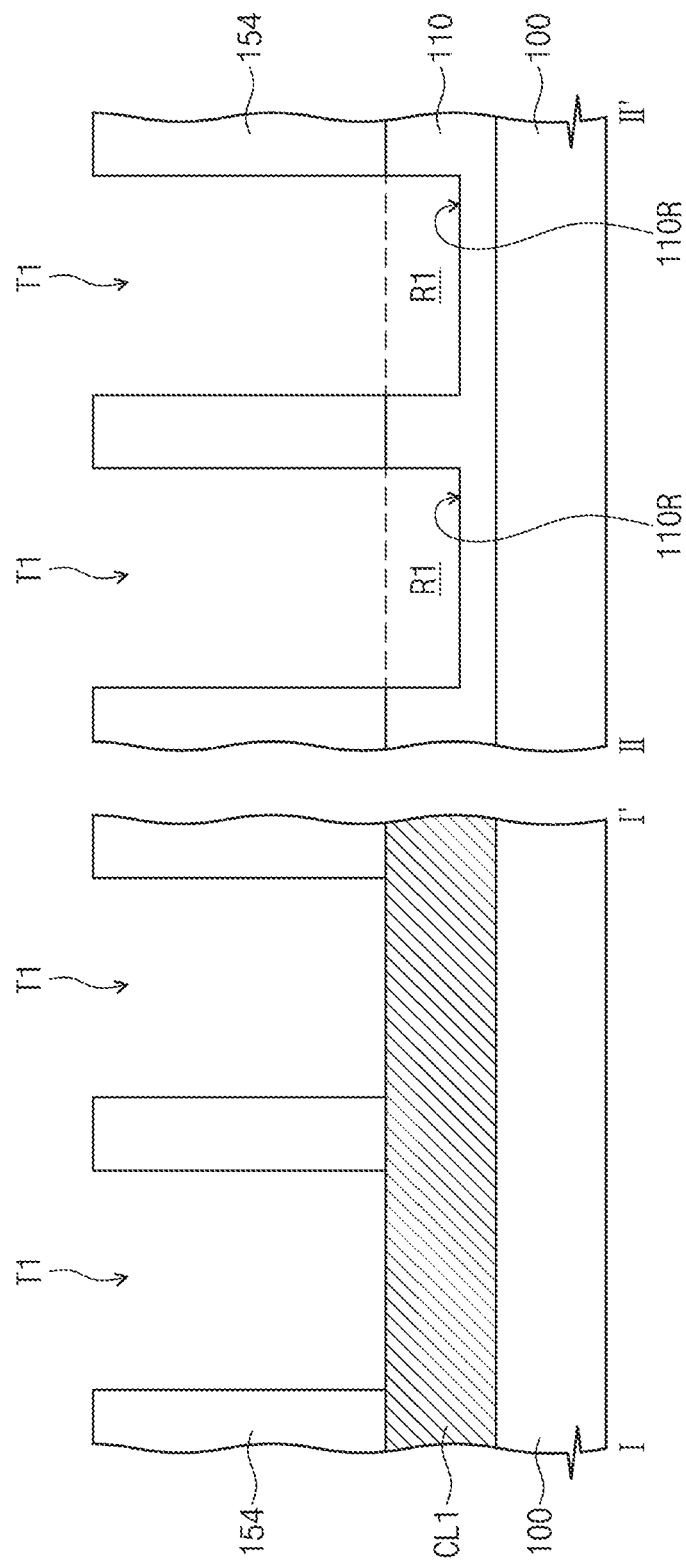
FIGS. 7A, 8A, 9A, 10A, 11A, 12A, 13A, 14A, and 15A illustrate cross-sectional views each taken along lines I-I' and II-II' of FIG. 3, showing a method of fabricating a variable resistance memory device according to example embodiments of the present inventive concepts.
Figure 7B:
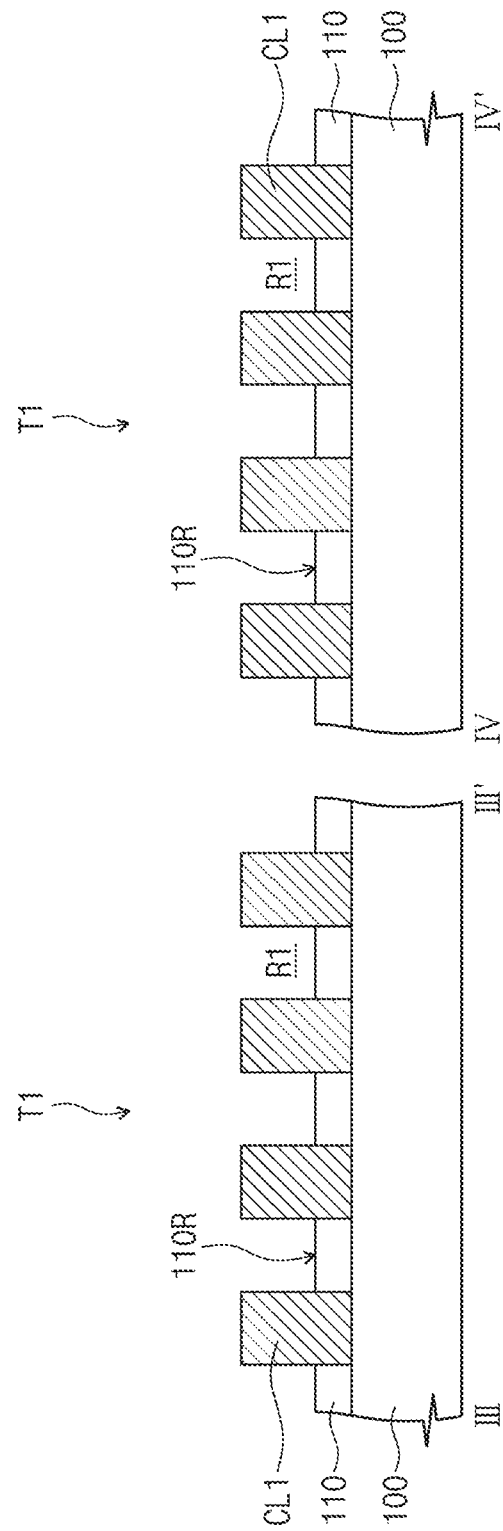
FIGS. 7B, 8B, 9B, 10B, 11B, 12B, 13B, 14B, and 15B illustrate cross-sectional views each taken along lines III-III' and IV-IV' of FIG. 3, showing a method of fabricating a variable resistance memory device according to example embodiments of the present inventive concepts.

Referring to FIGS. 6, 7A, and 7B, first conductive lines CL1 and first insulating patterns 110 may be formed on a substrate 100. The first conductive lines CL1 and the first insulating patterns 110 may extend in the first direction D1, and may be alternately and repeatedly arranged along the second direction D2. The formation of the first conductive lines CL1 may include, for example, forming a conductive layer on the substrate 100 and patterning the conductive layer. The formation of the first insulating patterns 110 may include, for example, depositing on the substrate 100 a first insulating layer to cover the first conductive lines CL1 and planarizing the first insulating layer to expose top surfaces of the first conductive lines CL1. In some embodiments, when the first insulating layer is deposited, the air gap 200 discussed with reference to FIG. 5B may be formed in the first insulating layer between the first conductive lines CL1. In this case, at least one of the first insulating patterns 110 may include the air gap 200 therein. The first insulating pattern 110 may include, for example, silicon nitride.

A mold layer 154 may be formed on the first conductive lines CL1 and the first insulating patterns 110 (Block 1000). The mold layer 154 may be formed on the substrate 100 to cover the top surfaces of the first conductive lines CL1 and top surfaces of the first insulating patterns 110. The mold layer 154 may include, for example, silicon nitride.

A first trench T1 may be formed in the mold layer 154 to run across the first conductive lines CL1 and the first insulating patterns 110 (Block 2000). The first trench T1 may extend in the second direction D2, and may expose the top surfaces of the first conductive lines CL1 and the top surfaces of the first insulating patterns 110. The formation of the first trench T1 may include etching the mold layer 154 until the top surfaces of the first conductive lines CL1 are exposed. Each top surface of the first insulating patterns 110 that is exposed to the first trench T1 may be recessed when the mold layer 154 is etched. Accordingly, the first insulating patterns 110 may each have a recess surface 110R, or a recessed top surface, and side surfaces of the first conductive lines CL1 may be exposed. First recess regions R1 may be defined by the recess surfaces 110R of the first insulating patterns 110 and the exposed side surfaces of the first conductive lines CL1. Each of the first recess regions R1 may extend between a pair of neighboring first conductive lines CL1 from a bottom surface of the first trench T1, or from the top surfaces of the first conductive lines CL1.

Figure 8A:
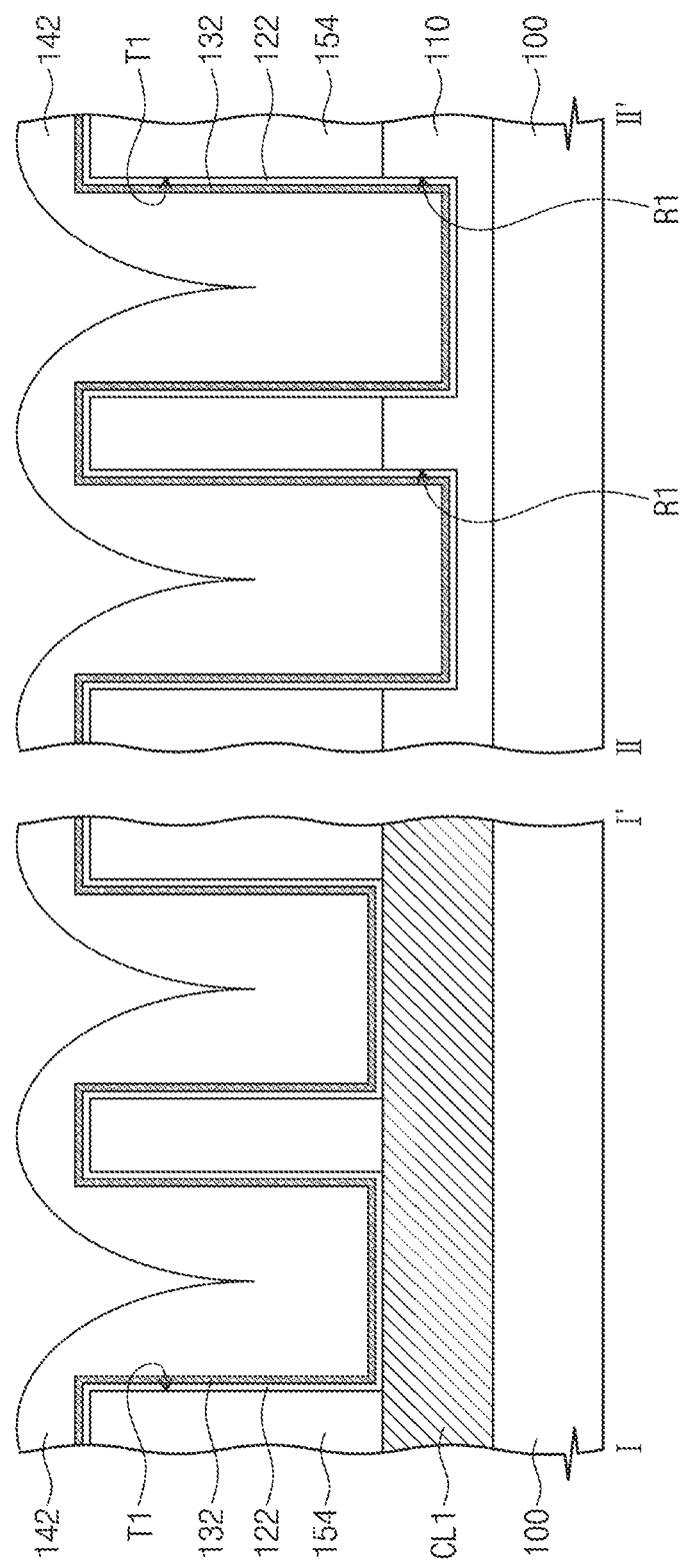
Figure 8B:
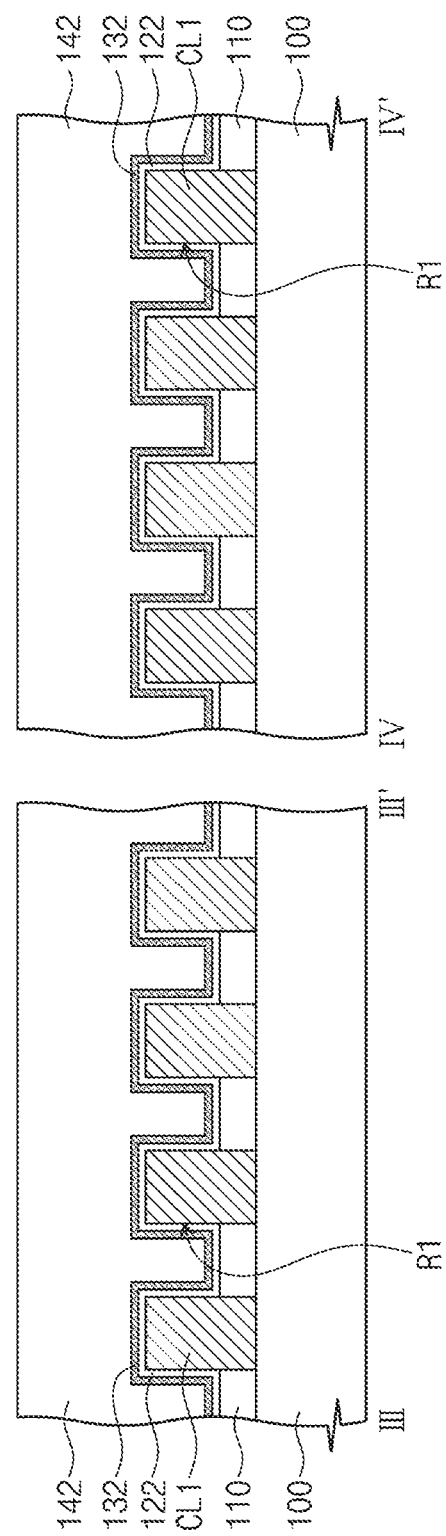

Referring to FIGS. 6, 8A, and 8B, a first sub-layer 132 and a second sub-layer 122 may be formed on the mold layer 154 to cover an inner surface of the first trench T1 (Block 3000). The second sub-layer 122 may be first formed on the mold layer 154 to conformally cover an inner side surface and the bottom surface (or, the top surfaces of the first conductive lines CL1) of the first trench T1. The second sub-layer 122 may be formed to partially fill each of the first recess regions R1. The second sub-layer 122 may conformally cover inner surfaces of the first recess regions R1, thereby covering the exposed side surfaces of the first conductive lines CL1 and the recess surfaces 110R of the first insulating patterns 110. The first sub-layer 132 may be formed on the second sub-layer 122. The first sub-layer 132 may extend along a top surface of the second sub-layer 122 and conformally cover the inner side and bottom surfaces of the first trench T1. The first sub-layer 132 may be formed to partially fill each of the first recess regions R1. The first sub-layer 132 may conformally cover the inner surfaces, which are previously/already covered with the second sub-layer 122, of the first recess regions R1, thereby covering the exposed side surfaces of the first conductive lines CL1 and the recess surfaces 110R of the first insulating patterns 110.

A second insulating layer 142 may be formed on the first sub-layer 132 to fill at least a portion of the first trench T1 (Block 4000). The second insulating layer 142 may fill a lower portion of the first trench T1 and further fill the remainder of each of the first recess regions R1. In some embodiments, when a deposition process is performed to form the second insulating layer 142, the air gap 200 discussed with reference to FIG. 5B may be formed in the second insulating layer 142 between the first conductive lines CL1. In this case, the air gap 200 may be included in at least one of second insulating patterns which will be discussed below.

In some embodiments, the second insulating layer 142 may include the same material as those of the first insulating patterns 110. For example, the second insulating layer 142 may include silicon nitride. Alternatively, the second insulating layer 142 may include a different material from those of the first insulating patterns 110. The first sub-layer 132 may include a different material from that of the second insulating layer 142. The first sub-layer 132 may include a material having an etch selectivity to the second insulating layer 142. For example, the first sub-layer 132 may include silicon oxide. The second sub-layer 122 may include a different material from that of the first sub-layer 132. When the first sub-layer 132 includes oxide, the second sub-layer 122 may be employed to protect/prevent surfaces of the first conductive lines CL1 from being oxidized during the formation of the first sub-layer 132. In some embodiments, the second sub-layer 122 may include the same material (i.e., a common material) as that of the second insulating layer 142. For example, the second sub-layer 122 may include silicon nitride.

Figure 9A:
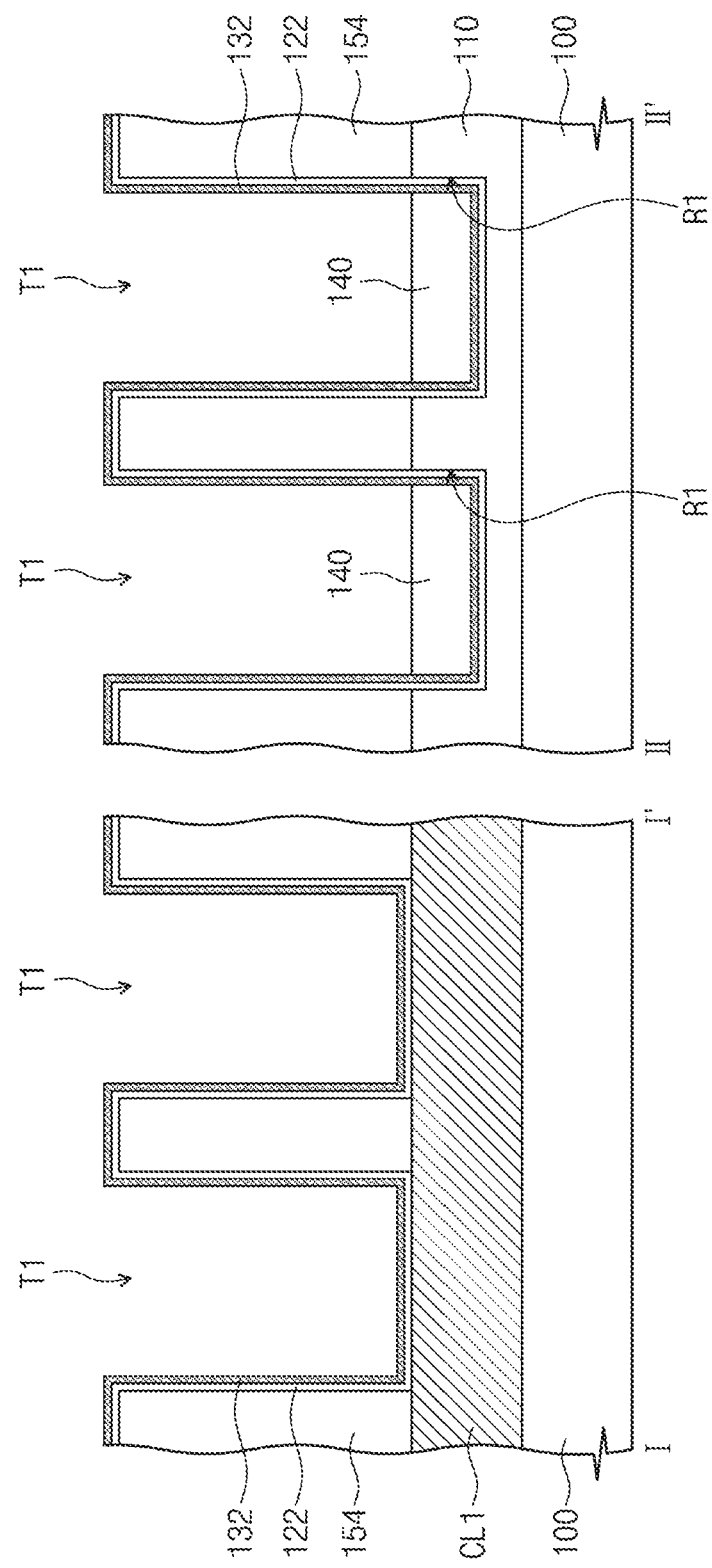
Figure 9B:
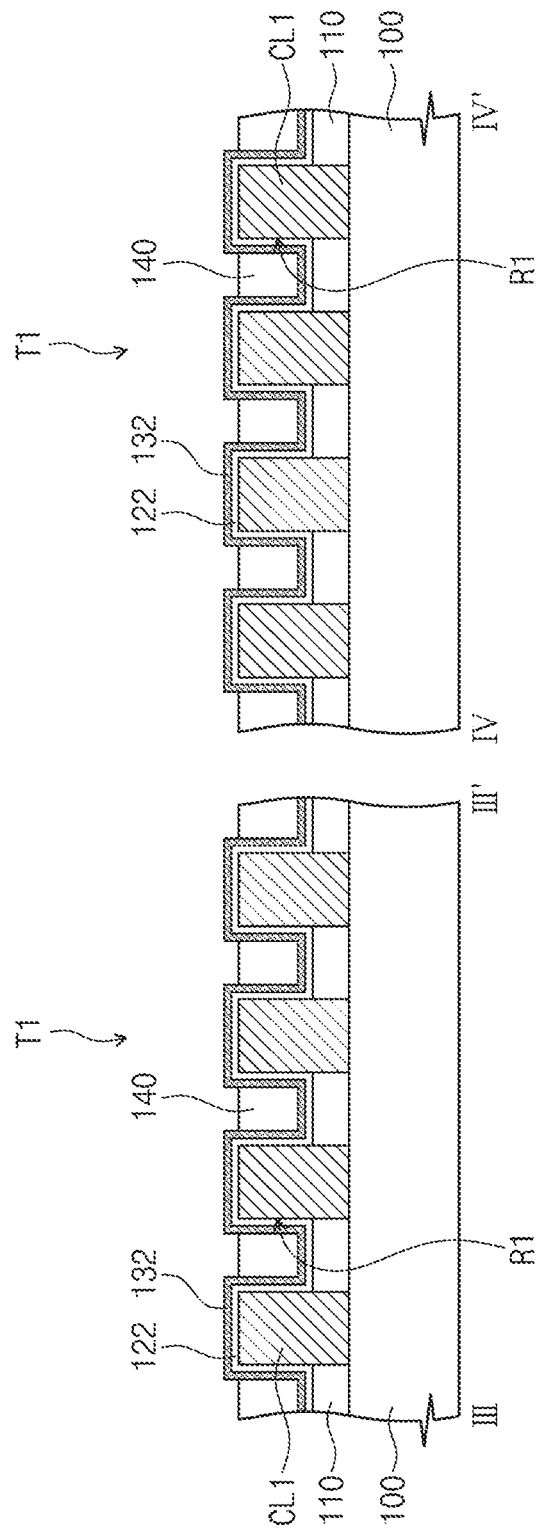

Referring to FIGS. 6, 9A, and 9B, the second insulating layer 142 may be etched to form second insulating patterns 140 on corresponding first insulating patterns 110 (Block 5000). The second insulating patterns 140 may be locally formed in (e.g., confined to) corresponding first recess regions R1. The formation of the second insulating patterns 140 may include removing portions of the second insulating layer 142 in the trench T1 by performing a first wet etching process that exhibits an etch selectivity to the first sub-layer 132. When the first wet etching process is performed, an etch rate of the first sub-layer 132 may be less than that of the second insulating layer 142. The first wet etching process may be performed until exposing the first sub-layer 132 on the inner side surface and the bottom surface (or, the top surfaces of the first conductive lines CL1) of the first trench T1. The first wet etching process may remove portions of the second insulating layer 142 in the first trench T1, and thereby, the second insulating patterns 140 may be locally formed in (e.g., may be confined to) respective/corresponding first recess regions R1.

Referring to FIGS. 6, 10A, 10B, 11A, and 11B, the first and second sub-layers 132 and 122 may be etched to form a first sub-insulating pattern 130 and a second sub-insulating pattern 120 that are provided between each of the first insulating patterns 110 and each of the second insulating patterns 140 (Block 6000).

Figure 10A:
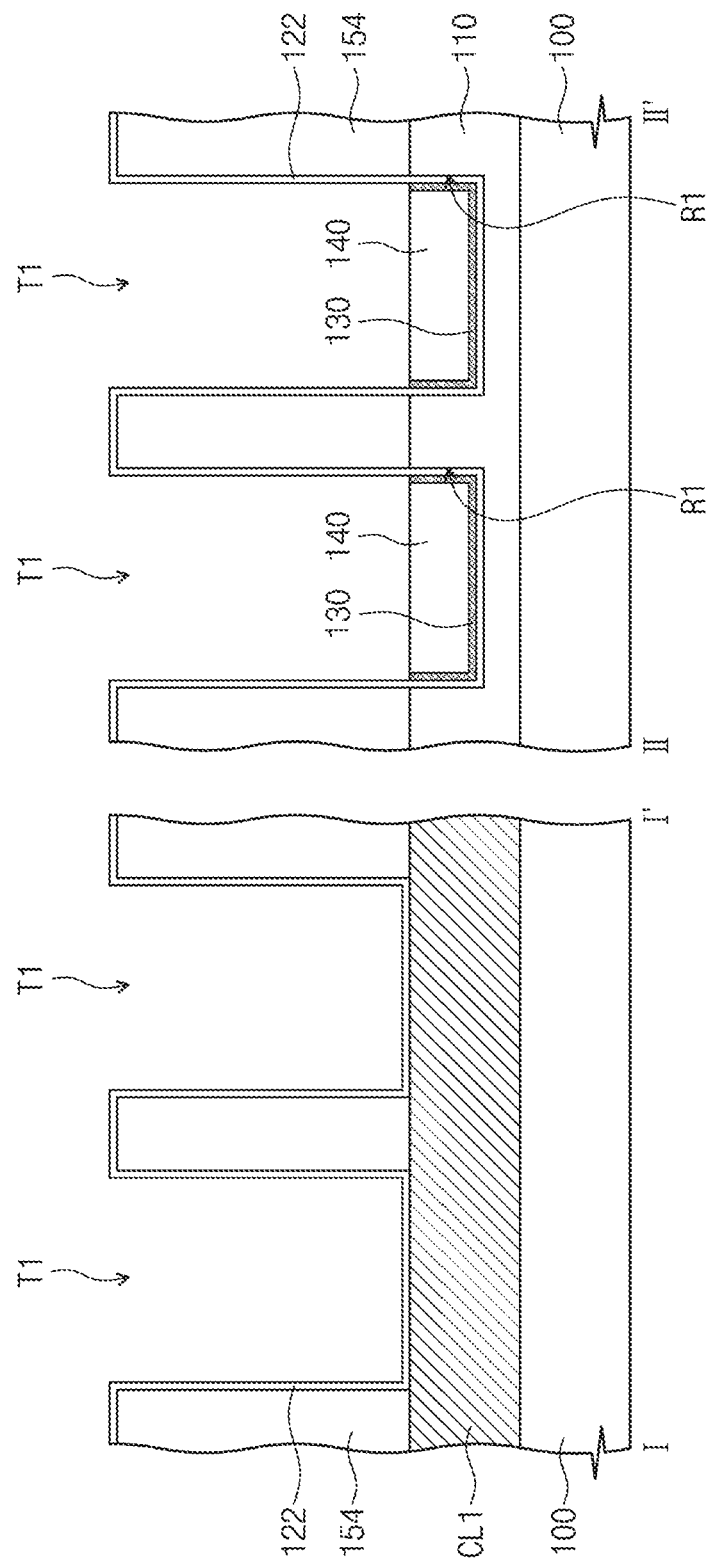
Figure 10B:
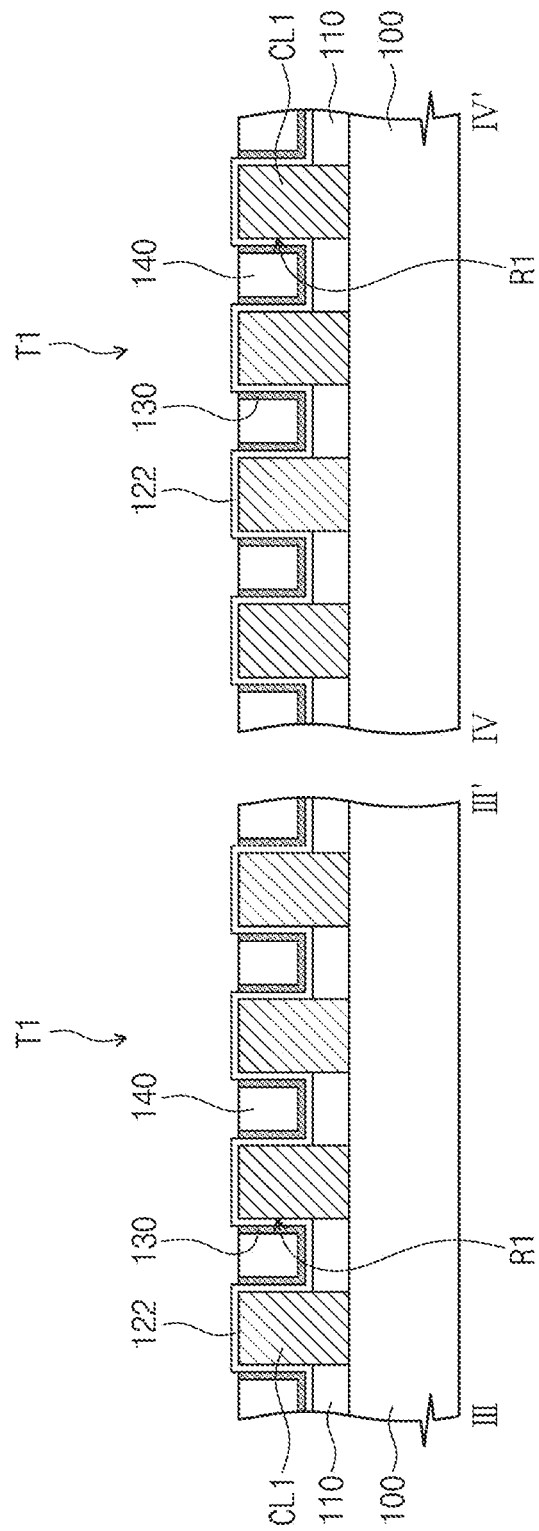

For example, referring to FIGS. 10A and 10B, the first sub-layer 132 may be etched to form a plurality of the first sub-insulating patterns 130. The plurality of the first sub-insulating patterns 130 may be locally formed in (e.g., may be confined to) respective/corresponding first recess regions R1. The plurality of the first sub-insulating patterns 130 may each be interposed between each of the first insulating patterns 110 and each of the second insulating patterns 140. Each of the second insulating patterns 140 may be spaced apart from the first conductive lines CL1 by/across each of the plurality of the first sub-insulating patterns 130. The formation of the plurality of the first sub-insulating patterns 130 may include performing a second wet etching process to remove portions of the first sub-layer 132 in the first trench T1. The second wet etching process may be performed until exposing the second sub-layer 122 on the inner side surface and the bottom surface (or, the top surfaces of the first conductive lines CL1) of the first trench T1. The second wet etching process may remove the first sub-layer 132 in the first trench T1, and thereby, the plurality of the first sub-insulating patterns 130 may be locally formed in (e.g., may be confined to) respective/corresponding first recess regions R1. The second wet etching process may be performed, for example, under an etch condition having an etch selectivity to the second sub-layer 122.

Figure 11A:
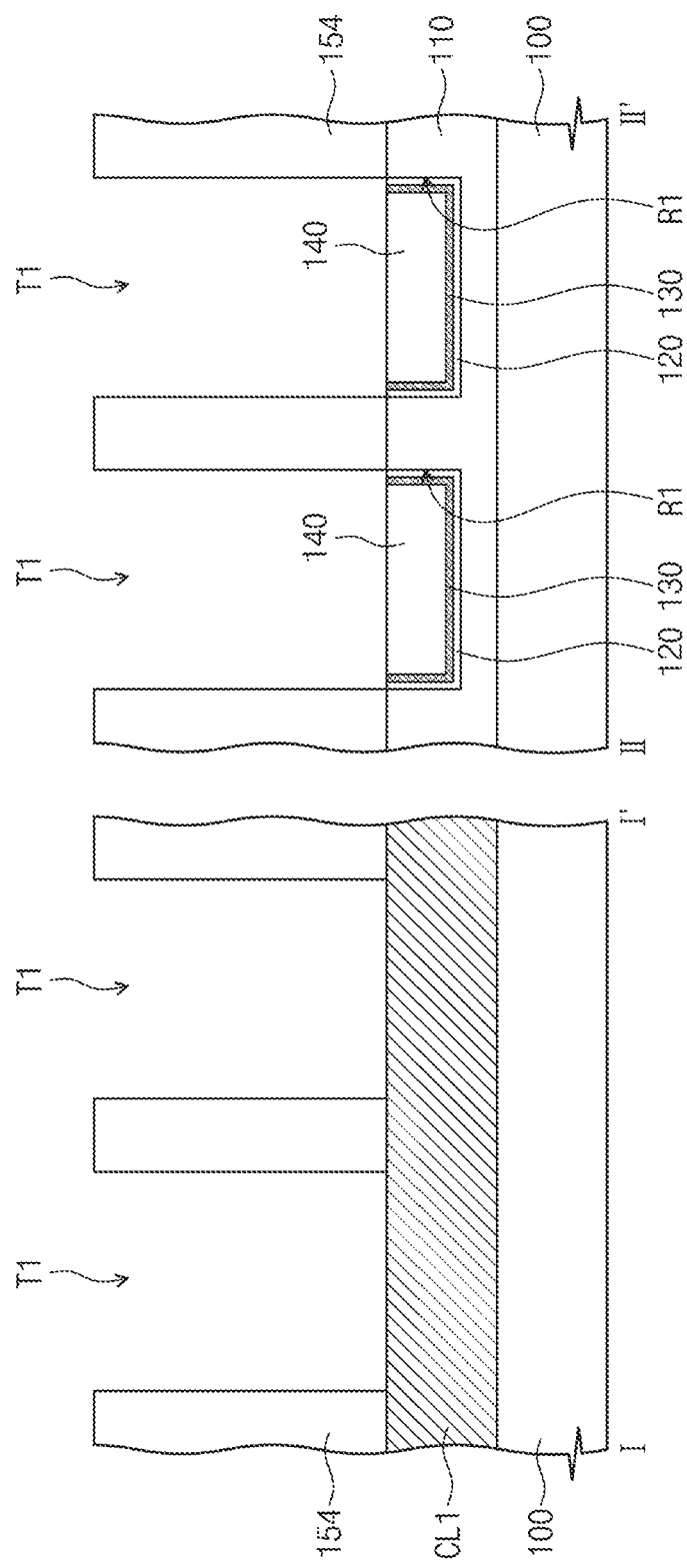
Figure 11B:
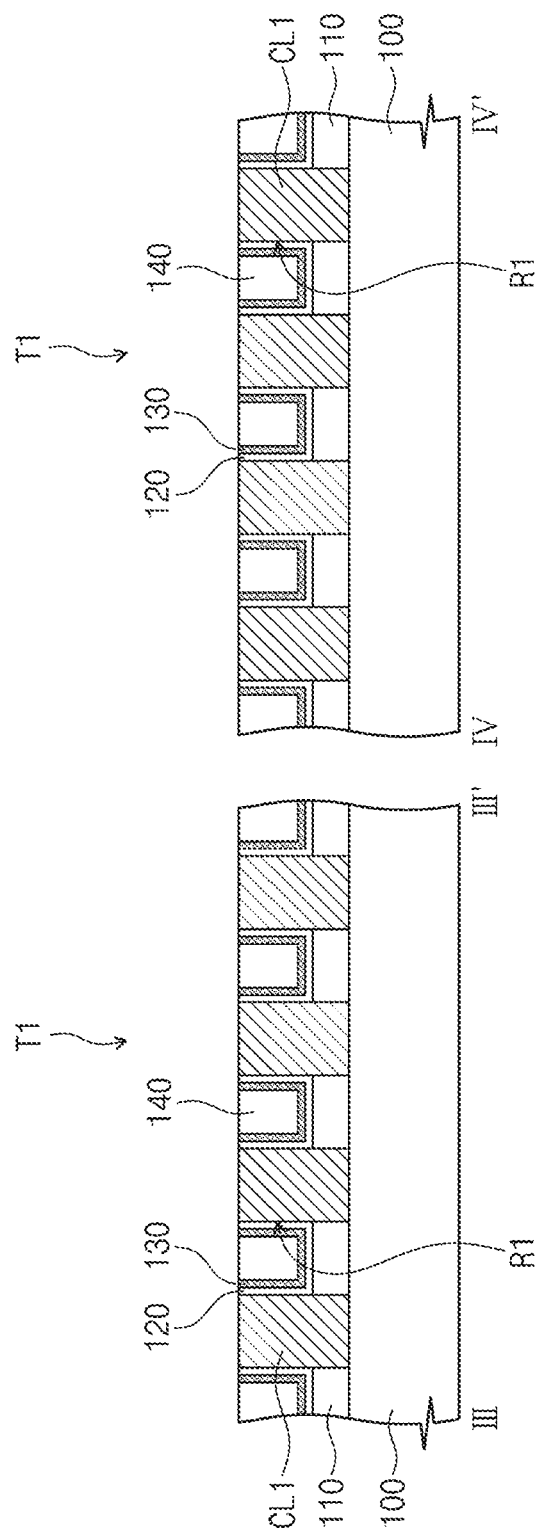

Referring to FIGS. 11A and 11B, the second sub-layer 122 may be etched to form a plurality of the second sub-insulating patterns 120. The plurality of the second sub-insulating patterns 120 may be locally formed in (e.g., may be confined to) respective/corresponding first recess regions R1. The plurality of the second sub-insulating patterns 120 may each be interposed between each of the first insulating patterns 110 and each of the plurality of the first sub-insulating patterns 130. Each of the first sub-insulating patterns 130 may be spaced apart from the first conductive lines CL1 by/across a respective one of the plurality of the second sub-insulating patterns 120. The formation of the plurality of the second sub-insulating patterns 120 may include performing a dry etching process to remove portions of the second sub-layer 122 in the first trench T1. The dry etching process may be performed until the top surfaces of the first conductive lines CL1 are exposed. The dry etching process may remove the second sub-layer 122 on the top surfaces of the first conductive lines CL1, and thereby, the plurality of the second sub-insulating patterns 120 may be locally formed in (e.g., may be confined to) respective/corresponding first recess regions R1. The dry etching process may be, for example, an etch-back process. In some embodiments, the dry etching process may remove the second sub-layer 122 on the inner side surface of the first trench T1. Alternatively, at least a portion of the second sub-layer 122 may remain on the inner side surface of the first trench T1.

Figure 12A:
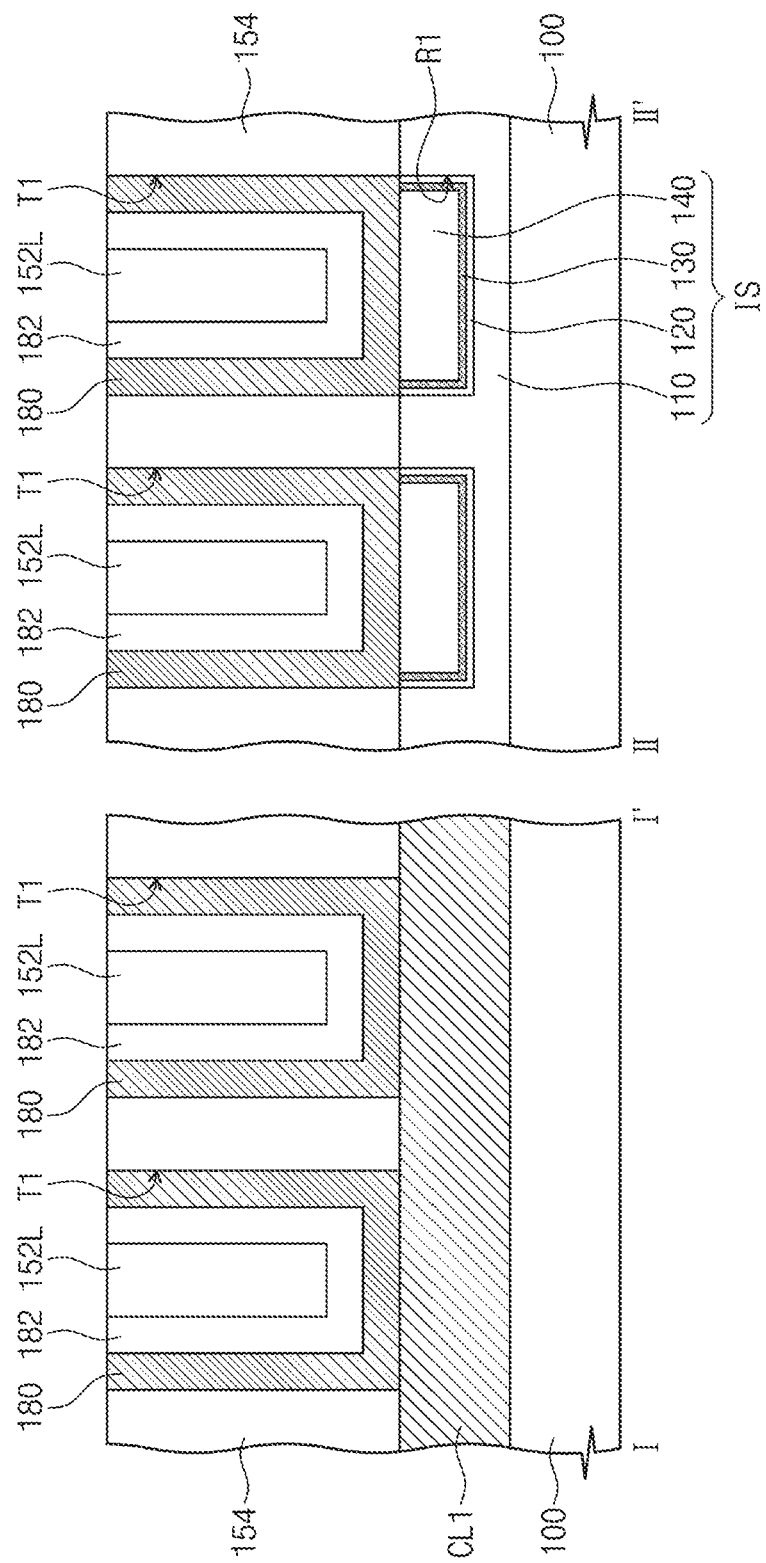
Figure 12B:
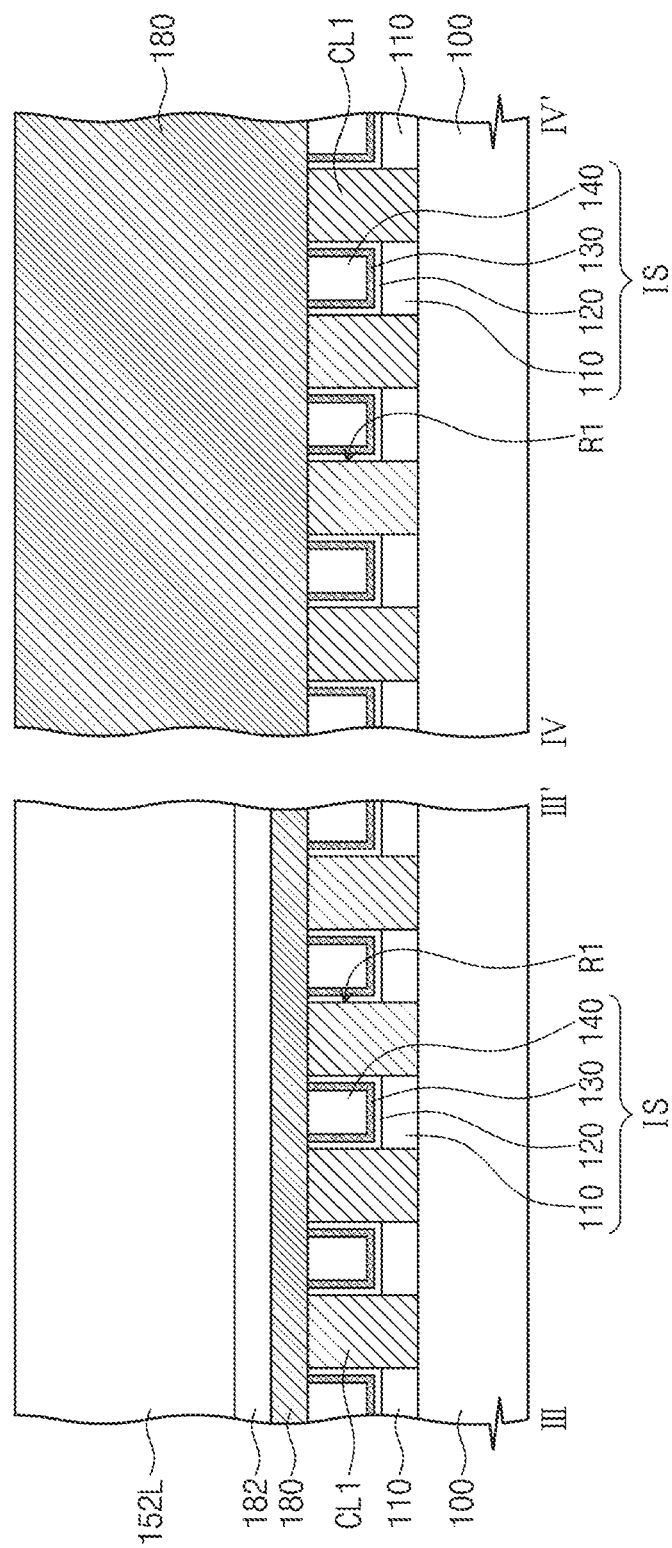

Referring to FIGS. 6, 12A, and 12B, a bottom electrode layer 180 may be formed to cover the inner surface of the first trench T1 (Block 7000). The bottom electrode layer 180 may be formed to partially fill the first trench T1. The bottom electrode layer 180 may conformally cover the inner side surface of the trench T1 and further cover the top surfaces, which are exposed to/by the trench T1, of the first conductive lines CL1. The bottom electrode layer 180 may cover each top surface of insulation structures IS that is exposed to/by the first trench T1. Between a pair of neighboring first conductive lines CL1, each of the insulation structures IS may include the first insulating pattern 110, the second insulating pattern 140, and the first and second sub-insulating patterns 130 and 120 between the first and second insulating patterns 110 and 140.

When the first trench T1 is formed in the mold layer 154 to run across the first conductive lines CL1 and the first insulating patterns 110, each top surface of the first insulating patterns 110 may be recessed while the mold layer 154 is etched. In this case, when the second insulating patterns 140 and the first and second sub-insulating patterns 130 and 120 are not formed in the recessed regions of the first insulating patterns 110 (i.e., in portions of the first recess regions R1), the bottom electrode layer 180 may fill at least a portion of each of the first recess regions R1. The bottom electrode layer 180 may be patterned so as to form bottom electrodes which will be discussed below, and when the bottom electrode layer 180 is patterned, it may be beneficial/necessary to remove the bottom electrode layer 180 in the first recess regions R1. The first recess regions R1 may be formed to have different depths from each other, and as a result, the bottom electrode layer 180 may be incompletely removed from the first recess regions R1 when the bottom electrode layer 180 is patterned. This incomplete removal may cause an electrical short between bottom electrodes formed in a subsequent process.

According to the present inventive concepts, the first recess regions R1 may be filled with at least the second insulating patterns 140. Therefore, the top surfaces of the insulation structures IS may be positioned at substantially the same height as those of the top surfaces of the first conductive lines CL1. In this case, when the bottom electrode layer 180 is patterned, the bottom electrode layer 180 may be readily removed from the top surfaces of the insulation structures IS. As a result, an electrical short may be inhibited, minimized, or prevented between bottom electrodes formed in a subsequent process.

A spacer layer 182 may be formed in the first trench T1 to partially fill the first trench T1. The spacer layer 182 may cover a top surface of the bottom electrode layer 180. The bottom electrode layer 180 may be interposed between the spacer layer 182 and the inner side surface of the first trench T1, between the spacer layer 182 and the top surfaces of the first conductive lines CL1, and between the spacer layer 182 and the top surfaces of the insulation structures IS. A buried insulating layer 152L may be formed to fill the remainder of the first trench T1. The buried insulating layer 152L may cover a top surface of the spacer layer 182. The spacer layer 182 may be interposed between the bottom electrode layer 180 and the buried insulating layer 152L.

The formation of the bottom electrode layer 180, the spacer layer 182, and the buried insulating layer 152L may include sequentially depositing on the mold layer 154 the bottom electrode layer 180, the spacer layer 182, and the buried insulating layer 152L so as to fill the first trench T1, and then planarizing the bottom electrode layer 180, the spacer layer 182, and the buried insulating layer 152L until a top surface of the mold layer 154 is exposed. The bottom electrode layer 180, the spacer layer 182, and the buried insulating layer 152L, which are formed in the first trench T1, may extend in the second direction D2, in plan view.

The bottom electrode layer 180 may include one or more of W, Ti, Al, Cu, C, CN, TiN, TiAlN, TiSiN, TiCN, WN, CoSiN, WSiN, TaN, TaCN, TaSiN, and TiO. The spacer layer 182 may include, for example, polycrystalline silicon or silicon oxide. The buried insulating layer 152L may include, for example, one or more of silicon oxide, silicon nitride, and silicon oxynitride.

Figure 13A:
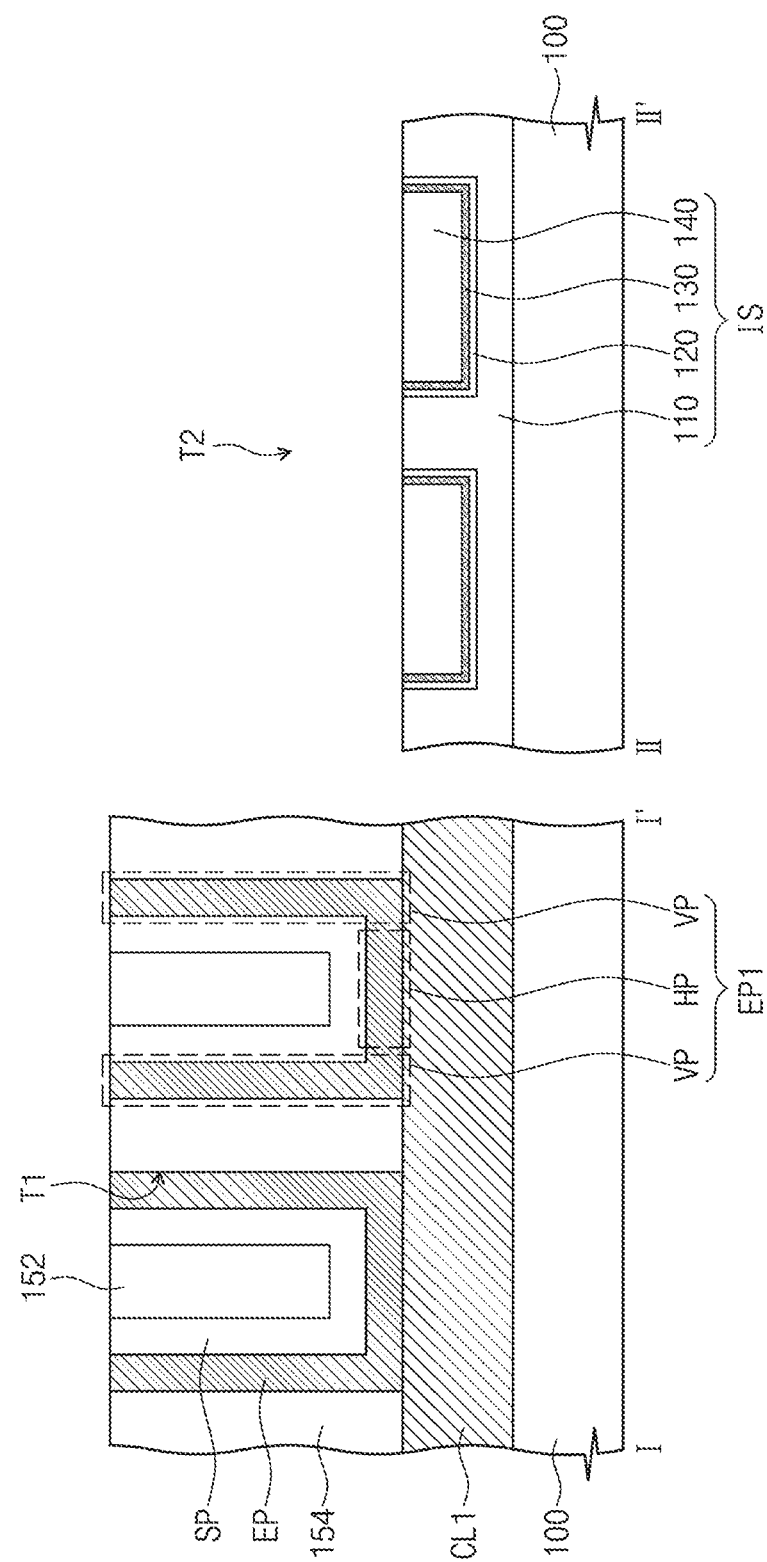
Figure 13B:
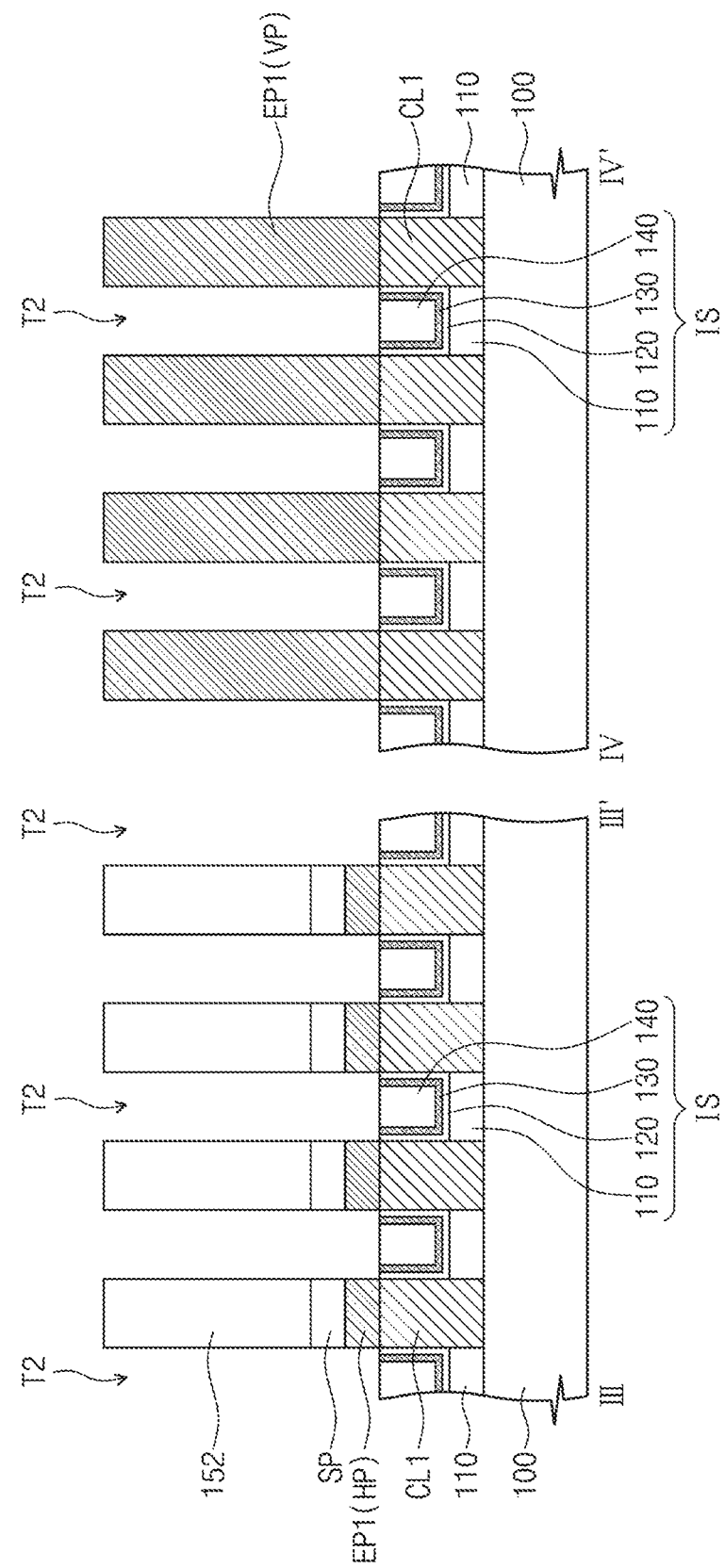

Referring to FIGS. 6, 13A, and 13B, a second trench T2 running across the first trench T1 may be formed in the mold layer 154 and the bottom electrode layer 180, thereby forming bottom electrodes EP1 (Block 8000). The formation of the second trench T2 may include patterning the bottom electrode layer 180, the spacer layer 182, and the buried insulating layer 152L to form the second trench T2 extending in the first direction D1. The second trench T2 may separate the bottom electrode layer 180 into the bottom electrodes EP1 spaced apart from each other in the second direction D2, and also separate the spacer layer 182 into spacers SP spaced apart from each other in the second direction D2. Moreover, the second trench T2 may separate the buried insulating layer 152L into buried insulating patterns 152 spaced apart from each other in the second direction D2.

The second trench T2 may be formed in plural. The plurality of second trenches T2 may be spaced apart from each other in the second direction D2, and may run across the first trench T1. The plurality of second trenches T2 may respectively/correspondingly expose the top surfaces of the insulation structures IS. The bottom electrodes EP1 may be provided on corresponding first conductive lines CL1.

Each of the bottom electrodes EP1 may include vertical portions VP on the inner side surface of the first trench T1 and a horizontal portion HP extending along the bottom surface of the first trench T1, or along a top surface of the corresponding first conductive line CL1. The vertical portions VP may be mutually connected through the horizontal portion HP. Each of the spacers SP may be provided between the vertical portions VP of each of the bottom electrodes EP1. Each of the spacers SP may be provided on facing sidewalls of the vertical portions VP, and may extend along a top surface of the horizontal portion HP. Each of the buried insulating patterns 152 may be provided between the vertical portions VP of a respective one of the bottom electrodes EP1, and spaced apart from the respective one of the bottom electrodes EP1 by/across a respective one of the spacers SP.

Figure 14A:
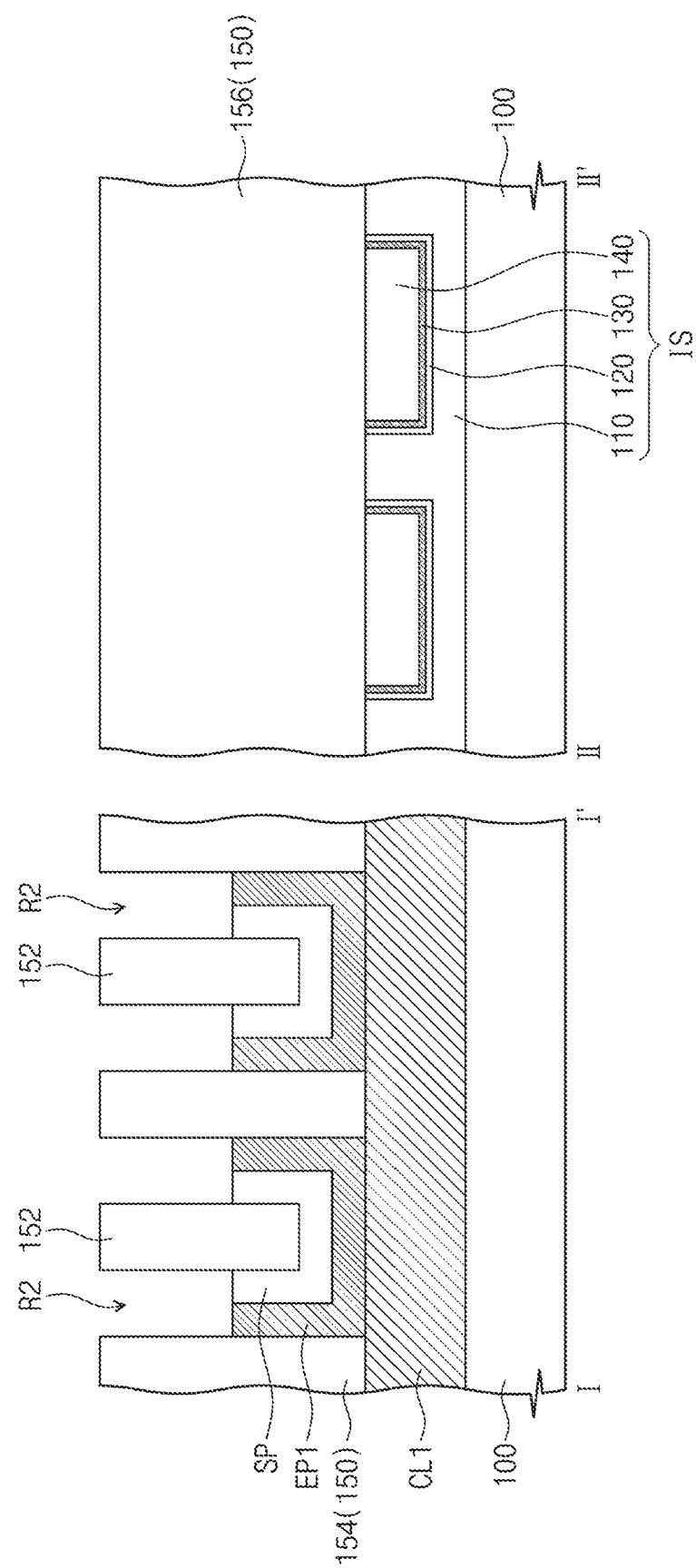
Figure 14B:
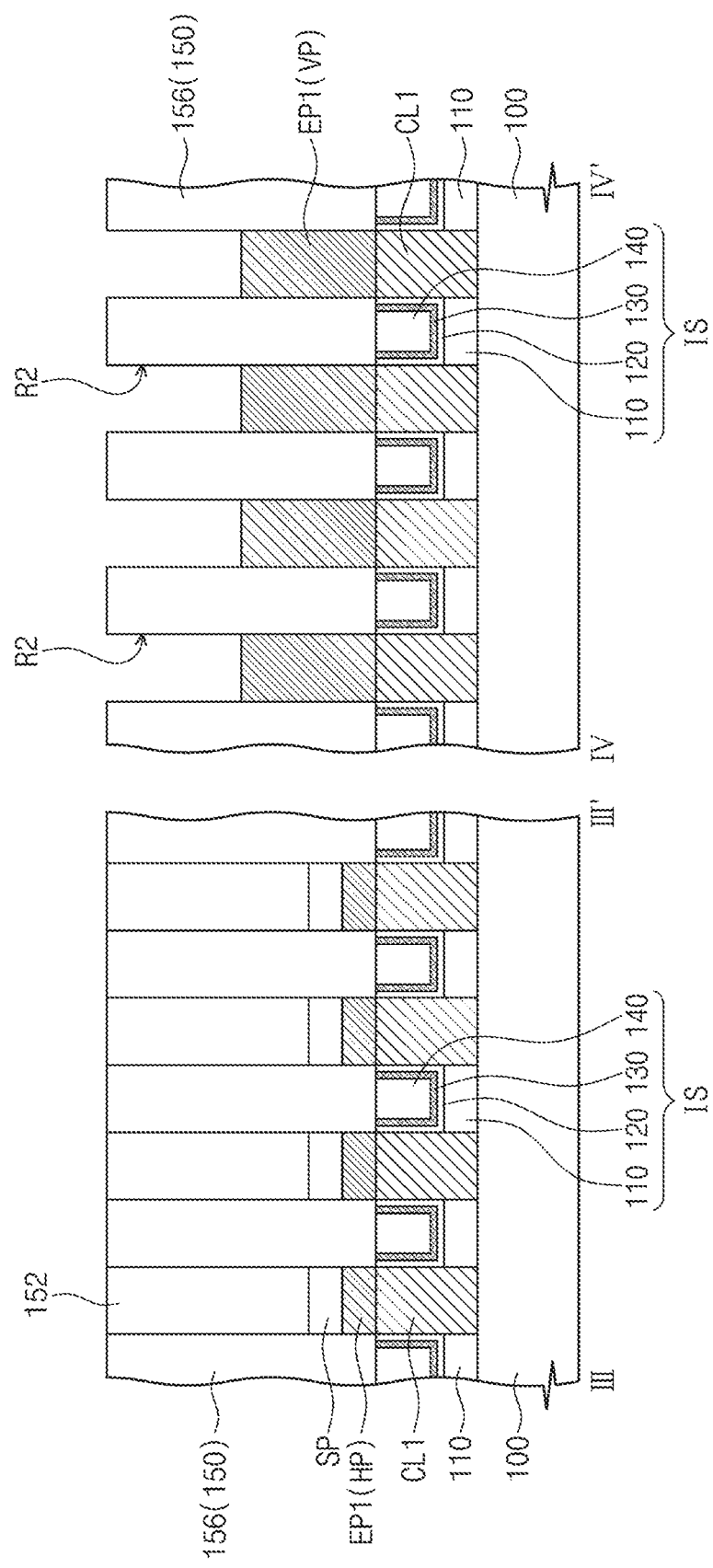

Referring to FIGS. 14A and 14B, an interlayer dielectric layer 156 may be formed to fill the second trench T2. The interlayer dielectric layer 156 may include, for example, one or more of silicon oxide, silicon nitride, and silicon oxynitride. The mold layer 154 and the interlayer dielectric layer 156 may be collectively referred to hereinafter as a first interlayer dielectric layer 150.

Upper portions of the bottom electrodes EP1 and upper portions of the spacers SP may be etched to form second recess regions R2 in the first interlayer dielectric layer 150. The second recess regions R2 may respectively/correspondingly expose the vertical portions VP of the bottom electrodes EP1. The second recess regions R2 may be spaced apart from each other in the first and second directions D1 and D2 in the first interlayer dielectric layer 150.

Figure 15A:
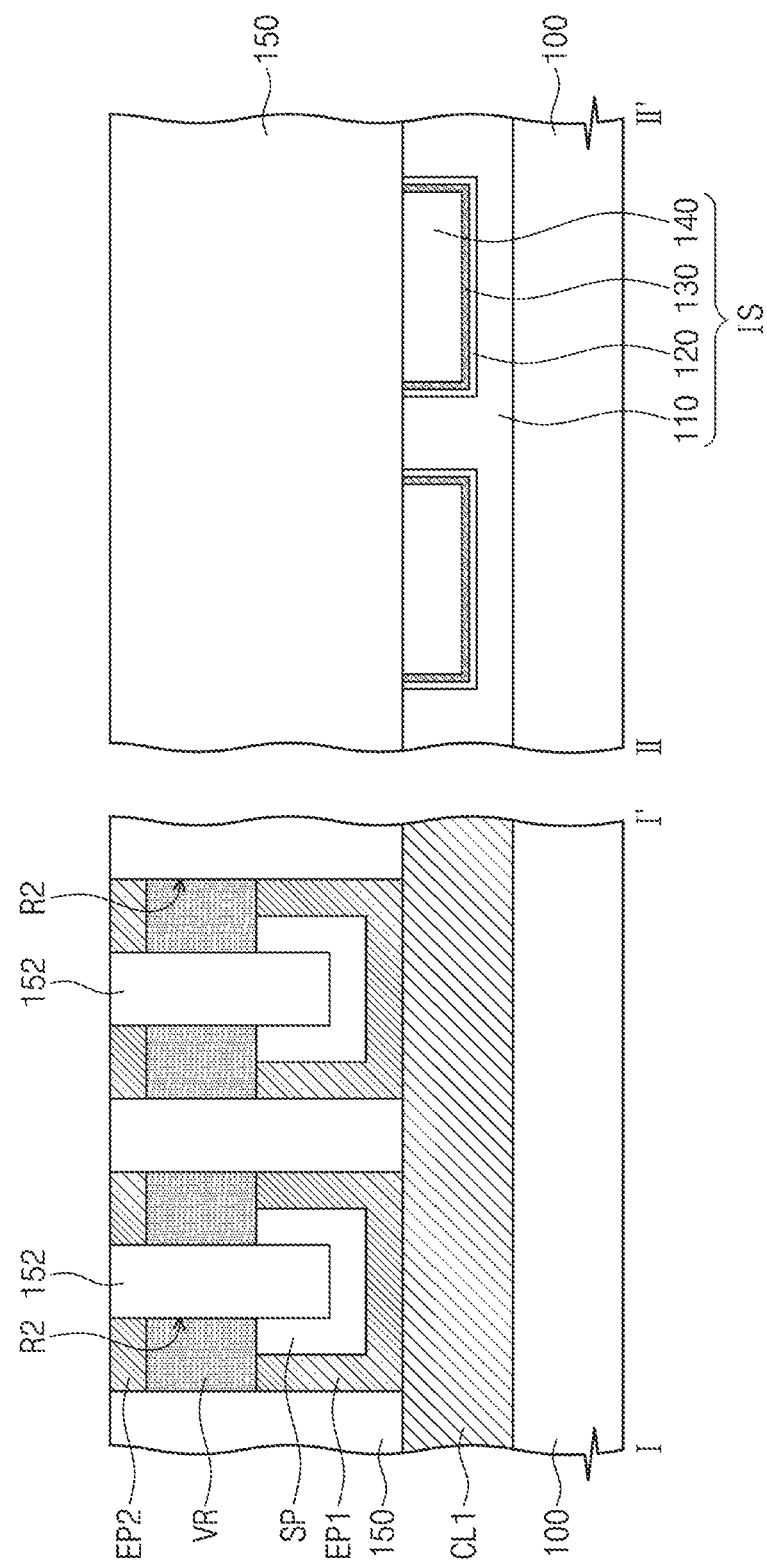
Figure 15B:
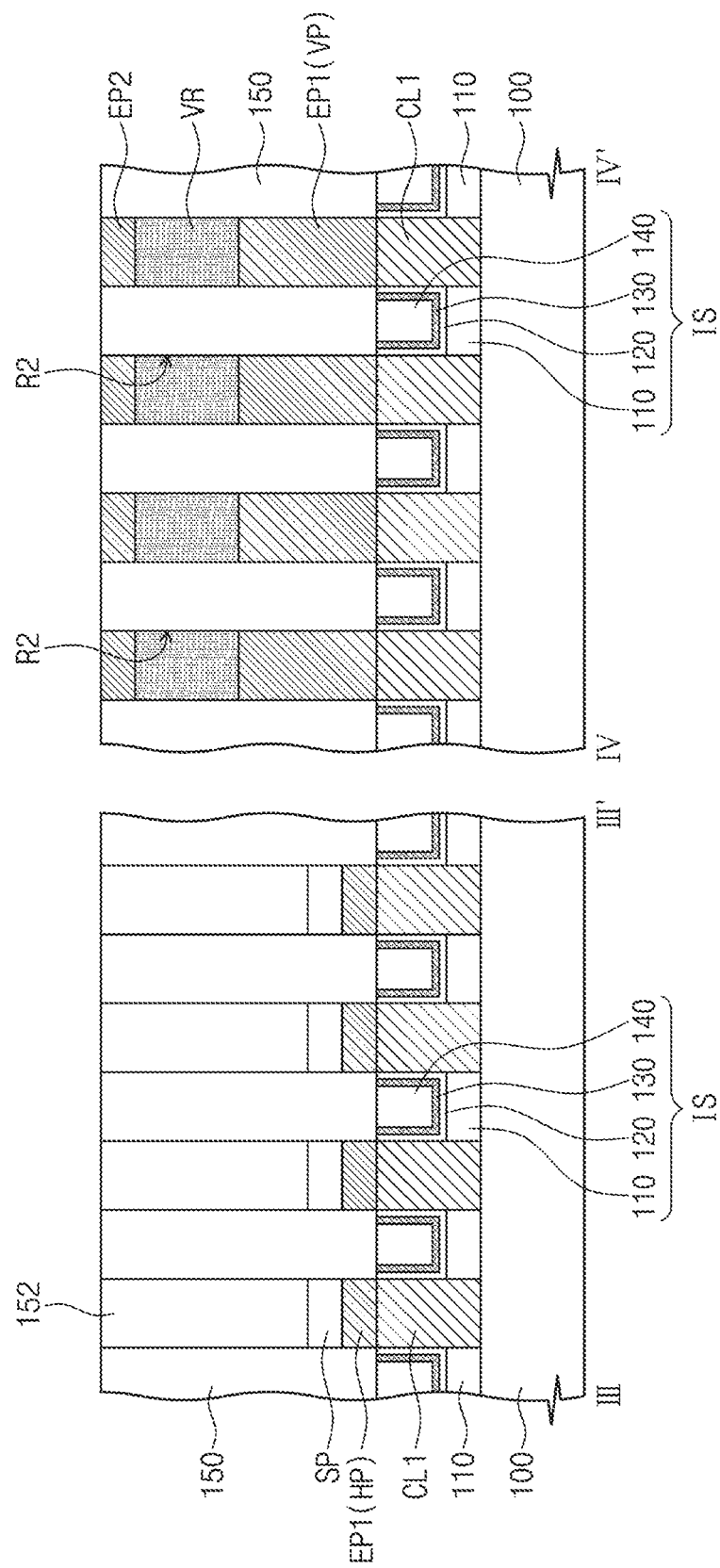

Referring to FIGS. 15A and 15B, variable resistance elements VR may be formed in respective/corresponding second recess regions R2. Each of the variable resistance elements VR may be formed to fill a portion (e.g., a lower portion) of the respective/corresponding second recess region R2. Middle electrodes EP2 may be respectively/correspondingly formed in the second recess regions R2. The middle electrodes EP2 may be respectively/correspondingly formed on the variable resistance elements VR. Each of the middle electrodes EP2 may be formed to fill the remainder (e.g., an upper portion) of the respective/corresponding second recess region R2. The formation of the middle electrodes EP2 may include forming on the first interlayer dielectric layer 150 a middle electrode layer to fill the second recess regions R2 and planarizing the middle electrode layer until the first interlayer dielectric layer 150 is exposed.

Referring back to FIGS. 4A and 4B, select elements SW may be formed on (e.g., at a level above) the first interlayer dielectric layer 150. The select elements SW may be respectively/correspondingly formed on the middle electrodes EP2. Top electrodes EP3 may be respectively/correspondingly formed on the select elements SW. A second interlayer dielectric layer 160 may be formed on the first interlayer dielectric layer 150 on (e.g., to cover sidewalls of) the select elements SW and the top electrodes EP3. The second interlayer dielectric layer 160 may include, for example, one or more of silicon oxide, silicon nitride, and silicon oxynitride. Second conductive lines CL2 may be formed on the second interlayer dielectric layer 160. The second conductive lines CL2 may be formed using substantially the same process employed to form the first conductive lines CL1. The second conductive lines CL2 may extend in the second direction D2 and be spaced apart from each other in the first direction D1.

When a plurality of memory cell stacks are included in a variable resistance memory device according to example embodiments of the present inventive concepts, processes for forming the first conductive lines CL1, the insulation structures IS, the second conductive lines CL2, and the first memory cell stack MCA1 may be repeatedly performed.

Figure 16A:
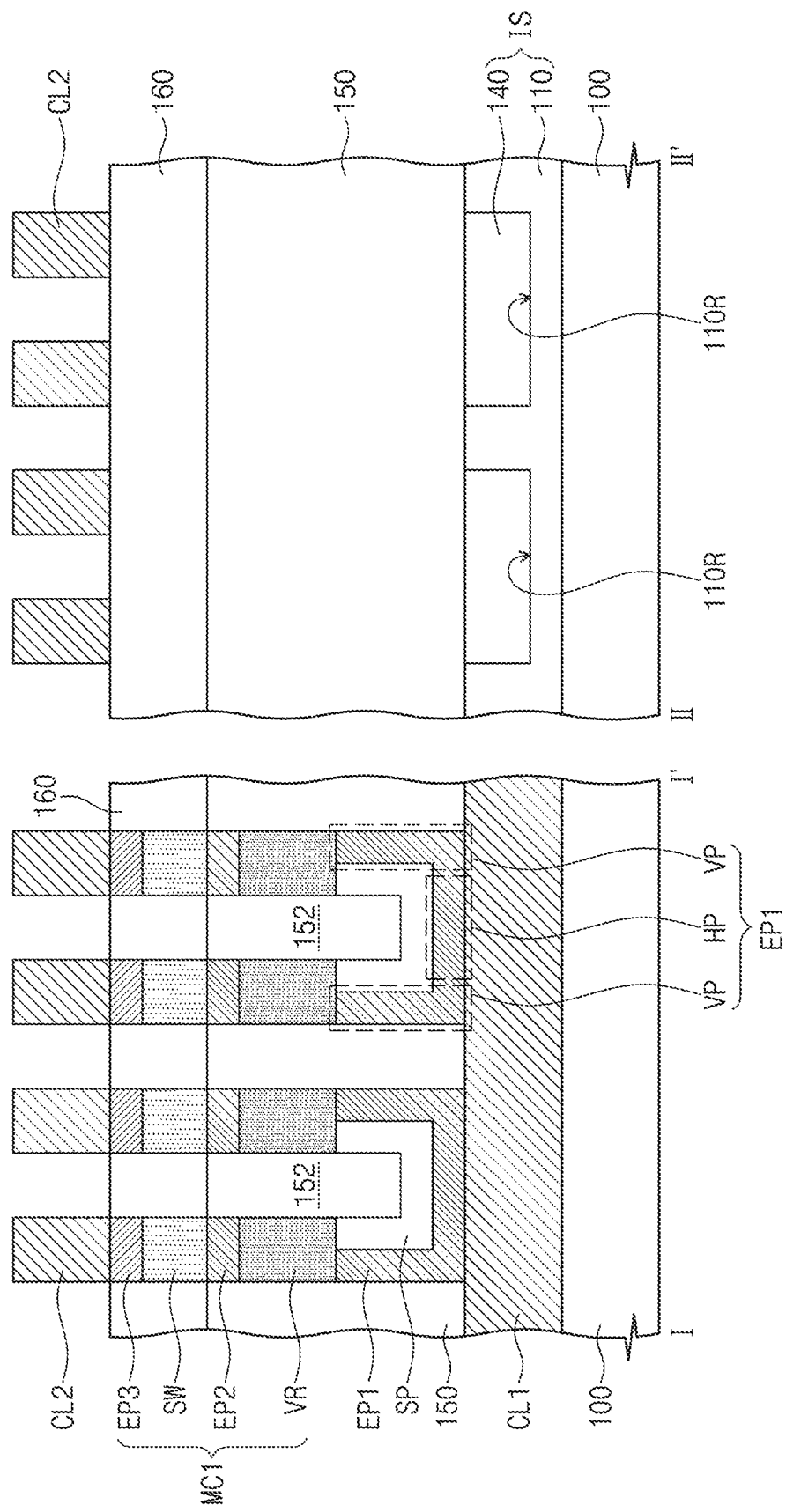
FIG. 16A illustrates a cross-sectional view taken along lines I-I' and II-II' of FIG. 3, showing a variable resistance memory device according to example embodiments of the present inventive concepts.
Figure 16B:
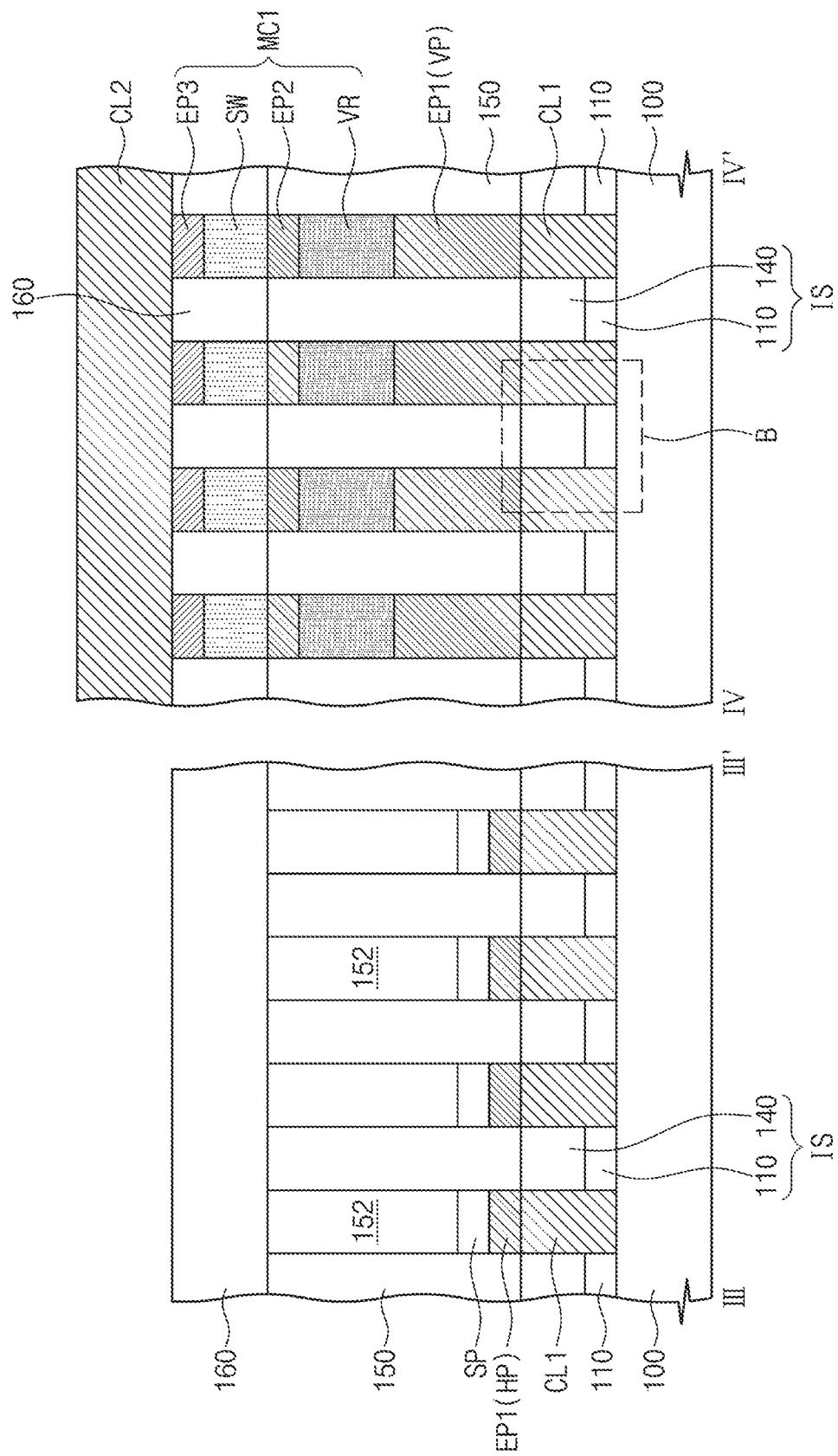
FIG. 16B illustrates a cross-sectional view taken along lines III-III' and IV-IV' of FIG. 3, showing a variable resistance memory device according to example embodiments of the present inventive concepts.
Figure 17:
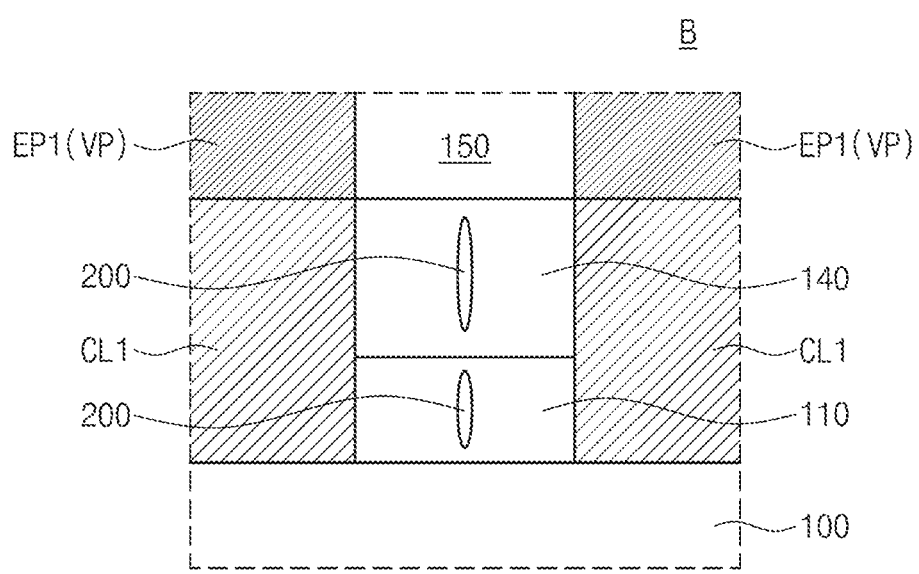
FIG. 17 illustrates an enlarged cross-sectional view showing section B of FIG. 16B.

FIG. 16A illustrates a cross-sectional view taken along lines I-I' and II-II' of FIG. 3, showing a variable resistance memory device according to example embodiments of the present inventive concepts. FIG. 16B illustrates a cross-sectional view taken along lines III-III' and IV-IV' of FIG. 3, showing a variable resistance memory device according to example embodiments of the present inventive concepts. FIG. 17 illustrates an enlarged cross-sectional view showing section B of FIG. 16B. In the discussion that follows, components the same as those of the variable resistance memory devices discussed with reference to FIGS. 3, 4A, 4B, 5A, and 5B are allocated the same reference numerals, and differences may be chiefly discussed for brevity of description.

Referring to FIGS. 3, 16A, and 16B, the first conductive lines CL1 may be provided on the substrate 100, and the first insulating pattern 110 may be provided between the first conductive lines CL1. The first insulating pattern 110 may be provided thereon with the second insulating pattern 140 interposed between the first conductive lines CL1. The second insulating pattern 140 may be inserted into the first insulating pattern 110. For example, the top surface of the first insulating pattern 110 may include the recess surface 110R, and the second insulating pattern 140 may be provided on the recess surface 110R of the first insulating pattern 110. According to some example embodiments, the second insulating pattern 140 may be in direct contact with the recess surface 110R and also in direct contact with sidewalls of the first conductive lines CL1.

As discussed with reference to FIG. 5A, the plurality of the second insulating patterns 140 may be provided on the first insulating pattern 110. The plurality of the second insulating patterns 140 may be spaced apart from each other in the first direction D1 on the first insulating pattern 110. Each of the plurality of the second insulating patterns 140 may be interposed between the first conductive lines CL1 and inserted into the first insulating pattern 110. For example, the top surface of the first insulating pattern 110 may include the plurality of the recess surfaces 110R spaced apart from each other in the first direction D1, and the plurality of the second insulating patterns 140 may be respectively/correspondingly provided on the plurality of the recess surfaces 110R. According to some example embodiments, the plurality of the second insulating patterns 140 may be respectively/correspondingly in contact with the plurality of the recess surfaces 110R, and each of the plurality of the second insulating patterns 140 may be in direct contact with the sidewalls of the first conductive lines CL1.

Referring to FIG. 17, in some embodiments, at least one of the first insulating pattern 110 and the second insulating pattern 140 may include the air gap 200 therein. When each of the first and second insulating patterns 110 and 140 includes the air gap 200, the air gap 200 of the second insulating pattern 140 may be vertically spaced apart (e.g., separated) from the air gap 200 of the first insulating pattern 110.

Referring back to FIGS. 3, 16A, and 16B, according to some example embodiments, the first insulating pattern 110 and the second insulating pattern 140 may be collectively referred to as the insulation structure IS. The second conductive lines CL2 may be provided to run across the first conductive lines CL1 and the insulation structure IS. A variable resistance memory device according to the example embodiments of FIGS. 16A, 16B, and 17 may be configured substantially the same as the variable resistance memory device discussed with reference to FIGS. 3, 4A, 4B, 5A, and 5B, except for the above differences.

Figure 18A:
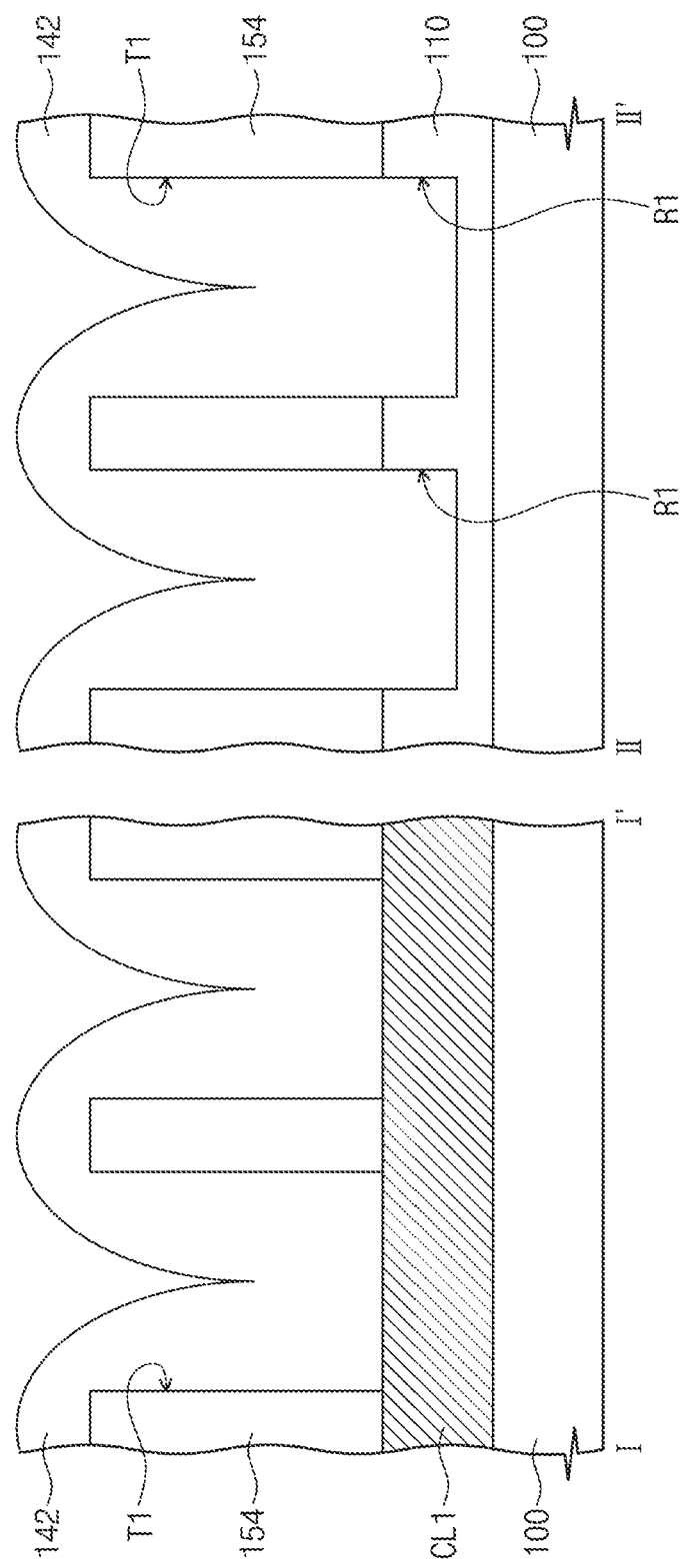
FIGS. 18A, 19A, and 20A illustrate cross-sectional views each taken along lines I-I' and II-II' of FIG. 3, showing a method of fabricating a variable resistance memory device according to example embodiments of the present inventive concepts.
Figure 18B:
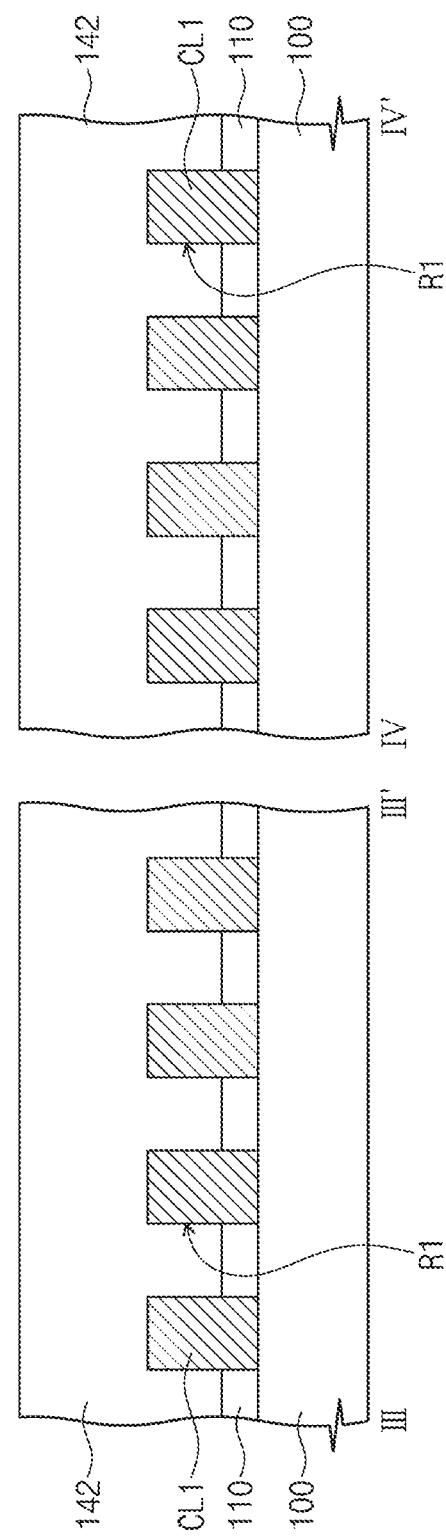
FIGS. 18B, 19B, and 20B illustrate cross-sectional views each taken along lines III-III' and IV-IV' of FIG. 3, showing a method of fabricating a variable resistance memory device according to example embodiments of the present inventive concepts.
Figure 19A:
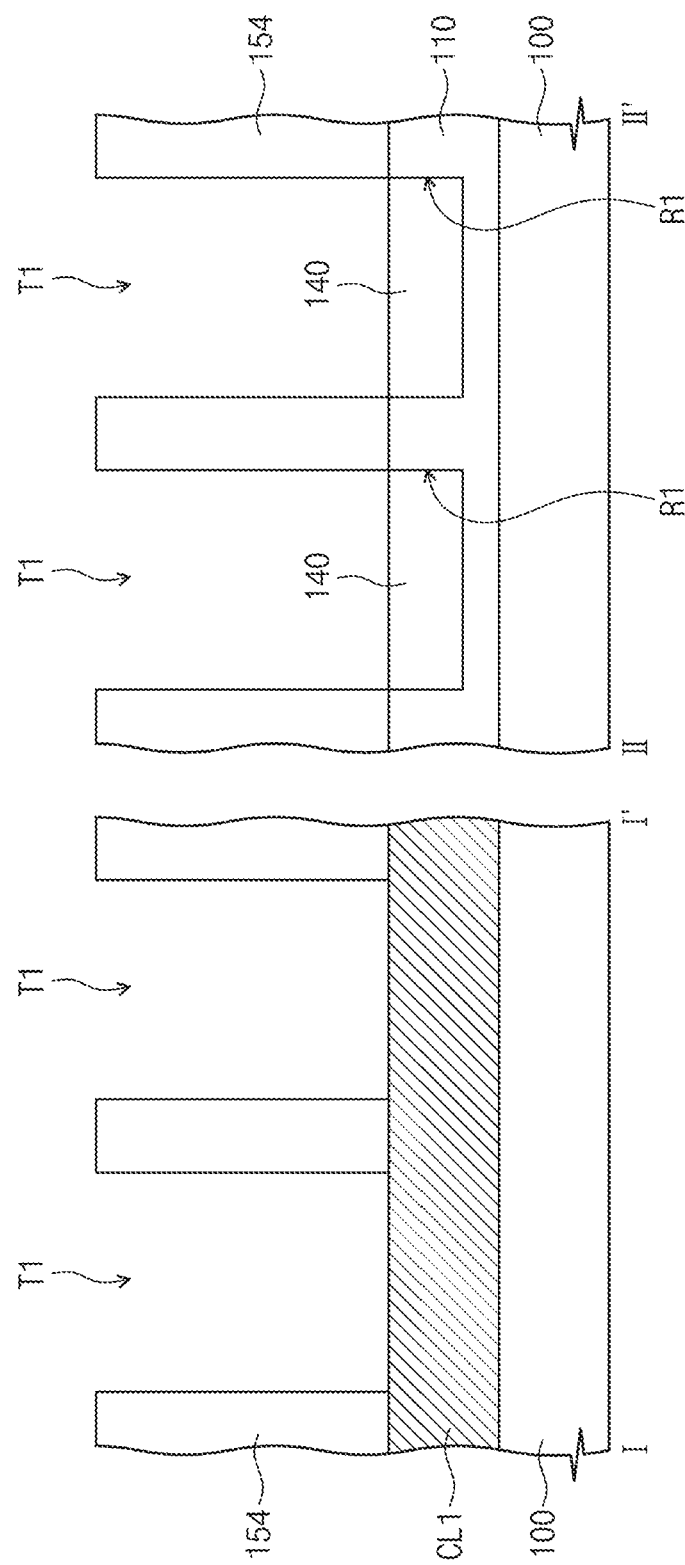
Figure 19B:
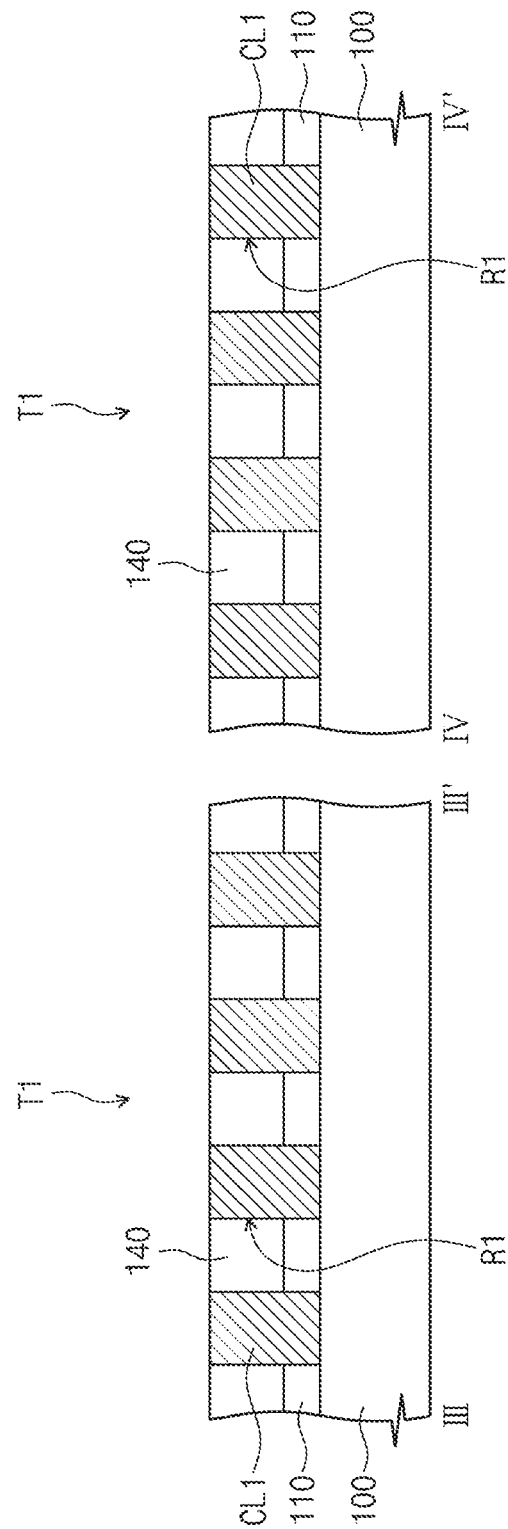
Figure 20A:
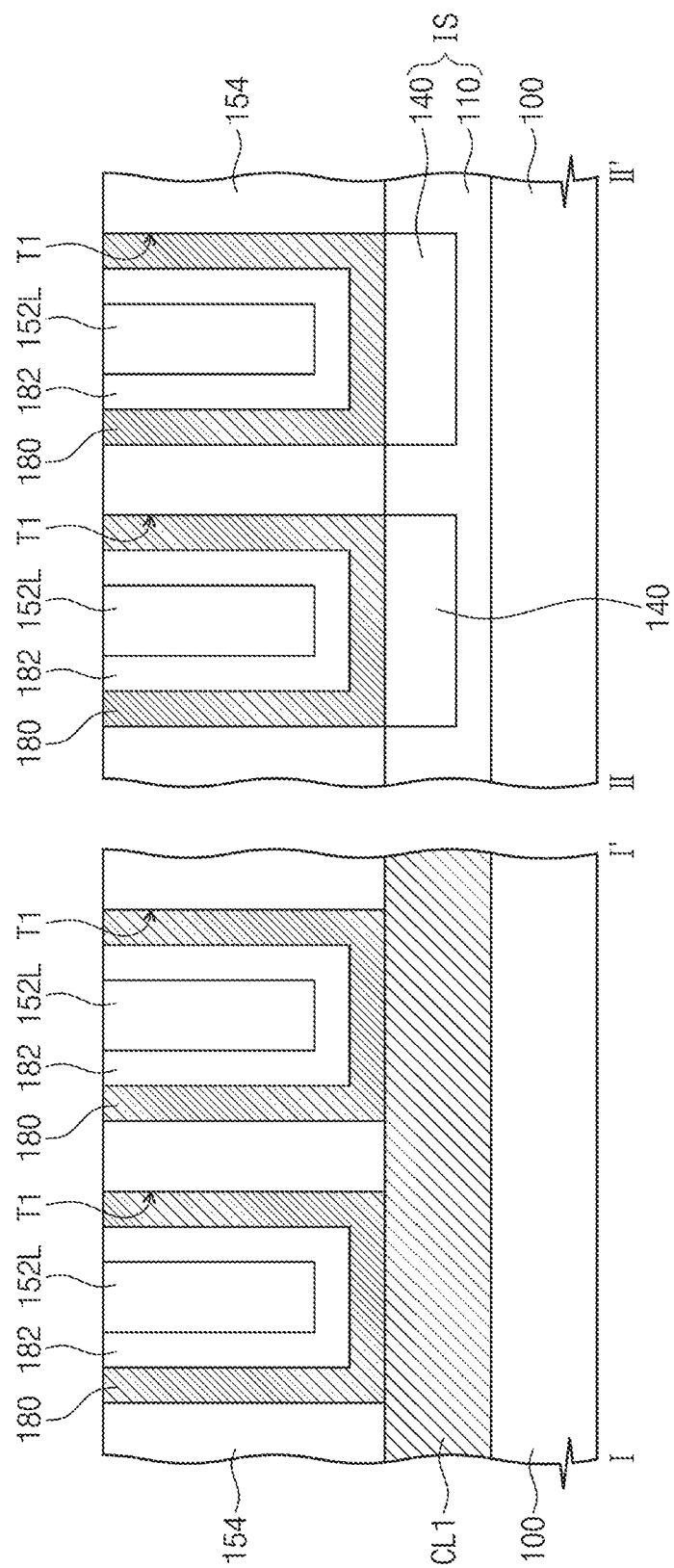
Figure 20B:
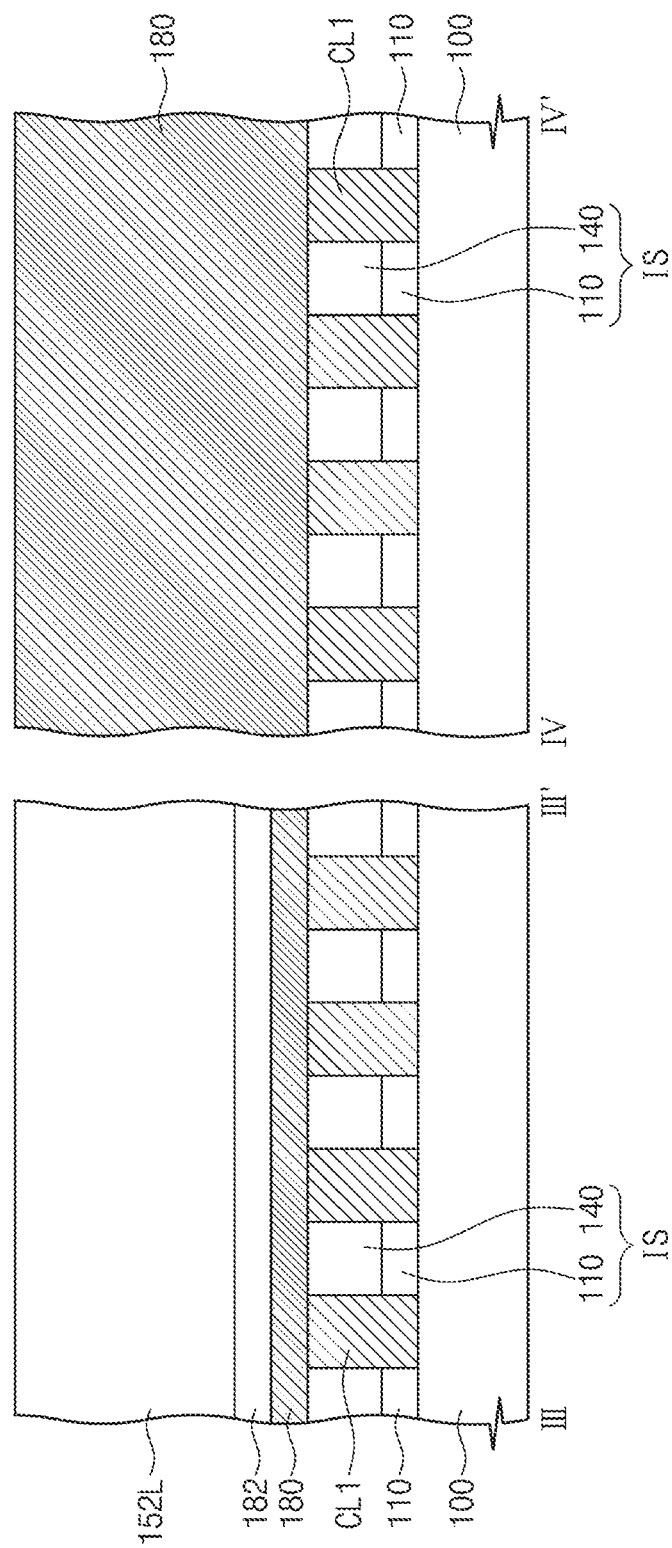

FIGS. 18A, 19A, and 20A illustrate cross-sectional views each taken along lines I-I' and II-II' of FIG. 3, showing a method of fabricating a variable resistance memory device according to example embodiments of the present inventive concepts. FIGS. 18B, 19B, and 20B illustrate cross-sectional views each taken along lines III-III' and IV-IV' of FIG. 3, showing a method of fabricating a variable resistance memory device according to example embodiments of the present inventive concepts. The following method is similar to the method of fabricating variable resistance memory devices as discussed with reference to FIGS. 6, 7A, 8A, 9A, 10A, 11A, 12A, 13A, 14A, and 15A, and 7B, 8B, 9B, 10B, 11B, 12B, 13B, 14B, and 15B, and thus the major differences between the methods may be chiefly explained in the interest of brevity of description.

As discussed with reference to FIGS. 6, 7A, and 7B, the first conductive lines CL1 and the first insulating patterns 110 may be formed on the substrate 100. The first conductive lines CL1 and the first insulating patterns 110 may extend in the first direction D1 and be alternately and repeatedly arranged along the second direction D2. The mold layer 154 may be formed on the substrate 100 to cover the first conductive lines CL1 and the first insulating patterns 110 (Block 1000). The first trench T1 may be formed in the mold layer 154 to run across the first conductive lines CL1 and the first insulating patterns 110 (Block 2000). The first trench T1 may extend in the second direction D2, and may expose the top surfaces of the first conductive lines CL1 and the top surfaces of the first insulating patterns 110. The formation of the first trench T1 may include etching the mold layer 154 until the top surfaces of the first conductive lines CL1 are exposed. Each top surface of the first insulating patterns 110 that is exposed to the first trench T1 may be recessed when the mold layer 154 is etched. Accordingly, the first insulating patterns 110 may each have the recess surface 110R, or a recessed top surface, and the side surfaces of the first conductive lines CL1 may be exposed. The first recess regions R1 may be defined by the recess surfaces 110R of the first insulating patterns 110 and the exposed side surfaces of the first conductive lines CL1.

Referring to FIGS. 6, 18A, and 18B, the second insulating layer 142 may be formed on the mold layer 154 to fill at least a portion of the first trench T1 (Block 4000). The second insulating layer 142 may fill a lower portion of the first trench T1 and further fill the first recess regions R1. The second insulating layer 142 may be in direct contact with the inner surfaces of the first recess regions R1, or with the exposed side surfaces of the first conductive lines CL1 and the recess surfaces 110R of the first insulating patterns 110. According to example embodiments, it may be possible to omit/skip the operation(s) of Block 3000 of FIG. 6 where the first and second sub-layers 132 and 122 are formed in the first trench T1.

Referring to FIGS. 6, 19A, and 19B, the second insulating layer 142 may be etched to respectively/correspondingly form the second insulating patterns 140 on the first insulating patterns 110 (Block 5000). The second insulating patterns 140 may be locally formed in (e.g., may be confined to) respective/corresponding first recess regions R1. The formation of the second insulating patterns 140 may include, for example, removing portions of the second insulating layer 142 in the trench T1 by performing a wet etching process that exhibits an etch selectivity to the mold layer 142. The wet etching process may be performed until exposing the inner side surface and the bottom surface (or, the top surfaces of the first conductive lines CL1) of the first trench T1. Accordingly, the second insulating patterns 140 may be locally formed in (e.g., may be confined to) respective/corresponding first recess regions R1. The second insulating patterns 140 may be in direct contact with the inner surfaces of the first recess regions R1, or with the exposed side surfaces of the first conductive lines CL1 and the recess surfaces 110R of the first insulating patterns 110.

Referring to FIGS. 6, 20A, and 20B, the bottom electrode layer 180 may be formed to cover the inner side surface of the first trench T1 (Block 7000). According to example embodiments, it may be possible to omit/skip the operation(s) of Block 6000 of FIG. 6 where the first and second sub-insulating patterns 130 and 120 are formed between each of the first insulating patterns 110 and each of the second insulating patterns 140. The bottom electrode layer 180 may be formed to partially fill the first trench T1. The bottom electrode layer 180 may cover each top surface of the first conductive lines CL1 that is exposed to the first trench T1. The bottom electrode layer 180 may cover each top surface of the insulation structures IS that is exposed to the first trench T1. According to example embodiments, each of the insulation structures IS may include the first insulating pattern 110 and the second insulating pattern 140 that are provided between a pair of neighboring first conductive lines CL, and the first and second insulating patterns 110 and 140 may be in contact with each other. The spacer layer 182 may be formed in the first trench T1 to fill a portion of the first trench T1, and the buried insulating layer 152L may be formed to fill the remainder of the first trench T1.

Subsequent process may be substantially the same as those of the methods of fabricating variable resistance memory devices as discussed with reference to FIGS. 6, 13A, 14A, 15A, 13B, 14B, 15B, 4A, and 4B.

According to the present inventive concepts, the insulation structure IS may be provided between the first conductive lines CL1, and a top surface of the insulation structure IS may be at substantially the same height as those of the top surfaces of the first conductive lines CL1. The bottom electrode layer 180 may be formed to cover the top surface of the insulation structure IS and the top surfaces of the first conductive lines CL1, and thus when the bottom electrode layer 180 is patterned to form the bottom electrodes EP1, the bottom electrode layer 180 may be relatively effortlessly removed from the top surface of the insulation structure IS. As a result, an electrical short may be inhibited, minimized, or prevented between the bottom electrodes EP1. Therefore, present inventive concepts may provide variable resistance memory devices having improved electrical characteristics and methods of fabricating the same.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A variable resistance memory device comprising:
a pair of first conductive lines extending in a first direction;
a first insulating pattern extending in the first direction between the pair of first conductive lines;

a plurality of second insulating patterns on the first insulating pattern and between the pair of first conductive lines, the plurality of second insulating patterns being spaced apart from each other in the first direction and respectively being in a plurality of recesses in the first insulating pattern;

a sub-insulating pattern between the first insulating pattern and each of the plurality of second insulating patterns, the sub-insulating pattern including a different material from that of the plurality of second insulating patterns;

a pair of second conductive lines extending in a second direction crossing the first direction, the pair of second conductive lines crossing the pair of first conductive lines and the first insulating pattern; and a plurality of memory cells between the pair of first conductive lines and the pair of second conductive lines.

2. The variable resistance memory device of claim 1, wherein the sub-insulating pattern extends between each of the plurality of second insulating patterns and each of the pair of first conductive lines.

3. The variable resistance memory device of claim 1, wherein the sub-insulating pattern comprises:

a first sub-insulating pattern between the first insulating pattern and each of the plurality of second insulating patterns and extending between each of the plurality of second insulating patterns and each of the pair of first conductive lines; and a second sub-insulating pattern between the first sub-insulating pattern and each of the pair of first conductive lines.

4. The variable resistance memory device of claim 3, wherein the second sub-insulating pattern comprises a different material from that of the first sub-insulating pattern.

5. The variable resistance memory device of claim 1, wherein at least one of the first insulating pattern and the plurality of second insulating patterns comprises a gap therein.

6. The variable resistance memory device of claim 1, wherein each of the plurality of memory cells comprises a select element and a variable resistance element that are coupled in series between a respective one of the pair of first conductive lines and a respective one of the pair of second conductive lines.

7. The variable resistance memory device of claim 6, wherein the select element is between the respective one of the pair of first conductive lines and the variable resistance element, and the variable resistance element is between the select element and the respective one of the pair of second conductive lines.

8. The variable resistance memory device of claim 6, wherein the select element comprises a chalcogenide material.

9. The variable resistance memory device of claim 1, wherein the plurality of memory cells comprises first and second memory cells spaced apart from each other in the first direction, and wherein the first and second memory cells are commonly connected by a single electrode to one of the pair of first conductive lines.

10. The variable resistance memory device of claim 9, wherein the single electrode comprises:

first and second vertical portions connected to the first and second memory cells, respectively; and a horizontal portion connecting the first and second vertical portions.

11. A variable resistance memory device comprising:

a pair of first conductive lines extending in a first direction;

a first insulating pattern extending in the first direction between the pair of first conductive lines;

a plurality of second insulating patterns on the first insulating pattern and between the pair of first conductive lines, the plurality of second insulating patterns being spaced apart from each other in the first direction, and a portion of the first insulating pattern extending between the plurality of second insulating patterns, a sub-insulating pattern between the first insulating pattern and each of the plurality of second insulating patterns, the sub-insulating pattern including a different material from that of the plurality of second insulating patterns;

a pair of second conductive lines extending in a second direction crossing the first direction, the pair of second conductive lines crossing the pair of first conductive lines and the first insulating pattern; and a plurality of memory cells between the pair of first conductive lines and the pair of second conductive lines.

12. The variable resistance memory device of claim 11, wherein the sub-insulating pattern comprises:

a first sub-insulating pattern between the first insulating pattern and each of the plurality of second insulating patterns and extending between each of the plurality of second insulating patterns and each of the pair of first conductive lines; and a second sub-insulating pattern between the first sub-insulating pattern and each of the pair of first conductive lines.

13. The variable resistance memory device of claim 12, wherein the first sub-insulating pattern comprises a different material from that of the plurality of second insulating patterns, and the second sub-insulating pattern comprises a different material from that of the first sub-insulating pattern.

14. The variable resistance memory device of claim 13, wherein the second sub-insulating pattern comprises the same material as that of the plurality of second insulating patterns.

15. The variable resistance memory device of claim 11, wherein each of the plurality of memory cells comprises a select element and a variable resistance element that are coupled in series between a respective one of the pair of first conductive lines and a respective one of the pair of second conductive lines, and wherein the select element comprises a chalcogenide material.

16. The variable resistance memory device of claim 15, wherein the select element is between the respective one of the pair of first conductive lines and the variable resistance element, and the variable resistance element is between the select element and the respective one of the pair of second conductive lines.

17. A variable resistance memory device comprising:

a plurality of first conductive lines extending in a first direction;

an insulation structure extending in the first direction between the plurality of first conductive lines;

a plurality of second conductive lines extending in a second direction crossing the first direction, the plurality of second conductive lines crossing the plurality of first conductive lines and the insulation structure; and a plurality of memory cells between the plurality of first conductive lines and the plurality of second conductive lines, wherein the insulation structure comprises:

a first insulating pattern extending in the first direction between the plurality of first conductive lines;

a plurality of second insulating patterns on the first insulating pattern and between the plurality of first conductive lines, the plurality of second insulating patterns being spaced apart from each other in the first direction; and a sub-insulating pattern between the first insulating pattern and each of the plurality of second insulating patterns, the sub-insulating pattern including a different material from that of the plurality of second insulating patterns;

wherein at least one of the first insulating pattern and the plurality of second insulating patterns includes a gap therein.

18. The variable resistance memory device of claim 17, wherein the first insulating pattern includes a first gap therein, at least one of the plurality of second insulating patterns includes a second gap therein, and the first and second gaps are vertically spaced apart from each other.

19. The variable resistance memory device of claim 17, wherein the first insulating pattern includes a first gap therein, at least one of the plurality of second insulating patterns includes a second gap therein, and the first and second gaps are spaced apart from each other by the sub-insulating pattern.

20. The variable resistance memory device of claim 17, wherein the sub-insulating pattern comprises:

a first sub-insulating pattern between the first insulating pattern and each of the plurality of second insulating patterns and extending between each of the plurality of second insulating patterns and each of the plurality of first conductive lines; and a second sub-insulating pattern between the first sub-insulating pattern and each of the plurality of first conductive lines, and wherein the first sub-insulating pattern comprises a different material from that of the plurality of second insulating patterns.

\* \* \* \* \*